(12) United States Patent
Lee et al.

(10) Patent No.: US 12,519,482 B2
(45) Date of Patent: Jan. 6, 2026

(54) SAMPLING JITTER AND SKEW TOLERANT ANALOG-TO-DIGITAL CONVERTERS

(71) Applicant: Omni Design Technologies, Inc., Milpitas, CA (US)

(72) Inventors: Hae-Seung Lee, Lexington, MA (US); Manar El-Chammas, Austin, TX (US)

(73) Assignee: Omni Design Technologies, Inc., Milpitas, CA (US)

( * ) Notice: Subject to any disclaimer, the term of this patent is extended or adjusted under 35 U.S.C. 154(b) by 105 days.

(21) Appl. No.: 18/620,281

(22) Filed: Mar. 28, 2024

(65) Prior Publication Data

US 2025/0309908 A1 Oct. 2, 2025

(51) Int. Cl.
*H03M 1/12* (2006.01)

(52) U.S. Cl.
CPC ......... *H03M 1/1245* (2013.01); *H03M 1/121* (2013.01)

(58) Field of Classification Search
CPC .......................... H03M 1/1245; H03M 1/121
See application file for complete search history.

(56) References Cited

U.S. PATENT DOCUMENTS

| | | | | |
|---|---|---|---|---|
| 5,635,864 A * | 6/1997 | Jones | ...................... | H04N 5/455 327/63 |
| 7,088,281 B1 * | 8/2006 | Menkus | .............. | H03M 1/1033 341/120 |
| 7,429,944 B1 * | 9/2008 | Nairn | ........................ | G06F 1/08 341/155 |
| 9,503,114 B1 * | 11/2016 | Ali | ....................... | H03M 1/1245 |
| 9,503,115 B1 * | 11/2016 | Shin | ..................... | H03M 1/0836 |
| 9,780,796 B2 * | 10/2017 | Kou | ...................... | H03L 7/091 |
| 10,312,927 B1 | 6/2019 | Mirhaj et al. | | |
| 10,581,446 B1 * | 3/2020 | Braswell | ................ | H03M 1/164 |
| 11,323,128 B2 * | 5/2022 | Sjöland | .............. | H03M 1/1023 |
| 11,349,491 B2 | 5/2022 | Bales et al. | | |
| 2007/0194960 A1 * | 8/2007 | Wang | ................... | H03M 1/1004 341/120 |
| 2008/0231338 A1 * | 9/2008 | Nairn | ........................ | G06F 1/08 327/292 |
| 2009/0146854 A1 * | 6/2009 | Kawahito | ............. | H03M 1/002 341/120 |
| 2010/0164622 A1 | 7/2010 | Ge et al. | | |

(Continued)

FOREIGN PATENT DOCUMENTS

CN 212463198 U * 2/2021
KR 20220066271 A * 5/2022 .......... H03M 1/1061

(Continued)

OTHER PUBLICATIONS

ISA, "International Search Report" for PCT App. No. PCT/US2025/017772, dated Apr. 25, 2025.

*Primary Examiner* — Chico A Foxx
(74) *Attorney, Agent, or Firm* — Intrinsic Law Corp.

(57) ABSTRACT

A derivative measurement circuit is configured to sample the input voltage of an input line to determine the time-derivative of the input voltage. A plurality of time-interleaved analog-to-digital converters (ADCs) are configured to convert respective input-voltage samples that are sampled at different times. The ADCs do not convert the input-voltage samples having respective time-derivatives that are above a predetermined threshold magnitude or that are relatively high to limit sampling clock jitter and sampling clock skew.

15 Claims, 16 Drawing Sheets

(56) References Cited

U.S. PATENT DOCUMENTS

| | | | |
|---|---|---|---|
| 2013/0176154 A1* | 7/2013 | Bonaccio | H03M 1/182 |
| | | | 341/118 |
| 2016/0079994 A1* | 3/2016 | Lee | H03M 1/46 |
| | | | 341/118 |
| 2018/0329448 A1* | 11/2018 | Arp | H03K 5/14 |
| 2021/0159908 A1* | 5/2021 | Singh | H03M 1/0626 |
| 2022/0271765 A1 | 8/2022 | Craninckx et al. | |
| 2023/0208429 A1* | 6/2023 | Molina | H03M 1/1009 |
| | | | 341/120 |

FOREIGN PATENT DOCUMENTS

| | | | | |
|---|---|---|---|---|
| KR | 102836724 B1 * | 7/2025 | | H03M 1/462 |
| WO | WO-2011010314 A2 * | 1/2011 | | H03M 1/74 |
| WO | WO-2015120315 A1 * | 8/2015 | | H03M 1/181 |

\* cited by examiner

SAMPLING JITTER AND SKEW TOLERANT ANALOG-TO-DIGITAL CONVERTERS

TECHNICAL FIELD

This application relates generally to analog-to-digital converters.

BACKGROUND

Analog-to-digital converters (ADCs) interface real-world analog signals with digital systems, and thus are used in many electronic systems. The exponential advances in digital integrated circuits demand matching performance increases in ADC performance, such as in input bandwidth, in sampling speed, and in signal-to-noise ratio (SNR). Improvements to ADC resolution and accuracy have been addressed by various digital calibration techniques. Improvements to ADC input bandwidth and sampling speed have been addressed by improved CMOS scaling as well as time-interleaving. Such advances have brought the deleterious effect of sampling clock jitter to the forefront. In addition, sampling clock skew between channels has hampered the performance of time-interleaved ADCs.

Sampling clock jitter introduces error in the sampling signal due to the uncertainty of the sampling instant. The uncertainty in the sampled voltage is $$\Delta v = \frac{dv_{in}}{dt} \Delta t$$

where $$\frac{dv_{in}}{dt}$$

is the time-derivative of the input signal and $\Delta t$ is the sample-time error due to sampling clock jitter. Thus, random sampling clock jitter introduces random error, thus random noise, in the sampled signal. Since the error is proportional to $$\frac{dv}{dt},$$

the error increases as the input signal's amplitude and frequency increase. As the bandwidths of the ADCs increase, the sampled error due to sampling clock jitter increases accordingly and limits the SNR of the ADC. Given root-mean square (RMS) sampling clock jitter $\sigma_t$, the maximum signal-to-noise ratio for a sinusoidal input at frequency $f_{in}$ is limited to $$SNR_{max} = \frac{1}{2\pi f_{in} \sigma_t}$$

Sampling clock jitter is caused by noise in devices in the clock signal generation and processing circuits as well as coupling from power supply noise and other signal paths. It is very difficult to reduce the RMS jitter below 100 fs without spending an inordinate amount of power in the clock generation and distribution circuitry. With 100 fs RMS jitter and a 10 GHz input signal, the maximum SNR is limited to 44 dB, or approximately 7 bits. Thus, unless the effect of sampling clock jitter is reduced, the performance of ADCs is severely limited.

The effect of sampling clock jitter has long been considered fundamental. The error in the sampling clock is exacerbated in time-interleaved ADCs because the timing skew between channels causes sampling error. The sampling error caused by sampling skew is more deterministic, and thus causes degradation in spurious-free dynamic range (SFDR), which is a critical performance parameter in many communication systems.

SUMMARY

Example embodiments described herein have innovative features, no single one of which is indispensable or solely responsible for their desirable attributes. The following description and drawings set forth certain illustrative implementations of the disclosure in detail, which are indicative of several exemplary ways in which the various principles of the disclosure may be carried out. The illustrative examples, however, are not exhaustive of the many possible embodiments of the disclosure. Without limiting the scope of the claims, some of the advantageous features will now be summarized. Other objects, advantages, and novel features of the disclosure will be set forth in the following detailed description of the disclosure when considered in conjunction with the drawings, which are intended to illustrate, not limit, the invention.

An aspect of the invention is directed to a time-interleaved circuit comprising a plurality of time-interleaved analog-to-digital converters (ADCs); a plurality of time-interleaved sampling circuits, each sampling circuit having an input electrically coupled to an input line having an input voltage, each sampling circuit associated with a respective time-interleaved ADC, the sampling circuits configured to sample the input voltage at respective sampling times and at a sampling frequency in a time-interleaved manner; a differentiator having an input electrically connected to the input line and producing, at an output of the differentiator, a differentiator output voltage that represents a derivative of the input voltage with respect to time; and a sample-selection circuit having a first input electrically coupled to the output of the differentiator, a respective second input electrically connected to a respective output of a respective sampling circuit, and a respective output electrically connected to a respective ADC. The sample-selection circuit is configured to electrically couple the respective sampling circuit to the respective ADC when a magnitude of the differentiator output voltage, at the respective sampling time of the respective sampling circuit, is lower than a threshold magnitude, and electrically decouple the respective sampling circuit from the respective ADC when the magnitude of the differentiator output voltage, at the respective sampling time of the respective sampling circuit, is higher than or equal to the threshold magnitude.

In one or more embodiments, the respective ADC is disabled when the magnitude of the differentiator output voltage, at the respective sampling time of the respective sampling circuit, is higher than or equal to the threshold magnitude. In one or more embodiments, the circuit further comprises a first comparator having a first input electrically connected to the output of the differentiator and a second input electrically connected to a first threshold input line having a first threshold voltage, the first threshold voltage having the threshold magnitude and a positive polarity, the first comparator producing a first-comparator output voltage at an output that is electrically connected to a first comparator input of the sample-selection circuit; and a second comparator having a first input electrically connected to the output of the differentiator and a second input electrically connected to a second threshold input line having a second threshold voltage, the second threshold voltage having the threshold magnitude and a negative polarity, the second comparator producing a second-comparator output voltage at an output that is electrically connected to a second comparator input of the sample-selection circuit, wherein the sample-selection circuit is further configured to electrically couple the respective sampling circuit to the respective ADC when the differentiator output voltage is lower than the first threshold voltage and higher than the second threshold voltage, and electrically decouple the respective sampling circuit from the respective ADC when the differentiator output voltage is higher than or equal to the first threshold voltage or lower than or equal to the second threshold voltage.

In one or more embodiments, the circuit further comprises a differentiator ADC having an input electrically connected to the output of the differentiator and an output electrically connected to the first input of the sample-selection circuit, the differentiator ADC configured to digitize the differentiator output voltage at the sampling frequency of the sampling circuits, wherein the sample-selection circuit is configured to electrically couple the respective sampling circuit to the respective ADC when a magnitude of a digital differentiator output signal is lower than a threshold digital value, and electrically decouple the respective sampling circuit from the respective ADC when the magnitude of the digital differentiator output signal is higher than or equal to the threshold digital value. In one or more embodiments, a resolution of the differentiator ADC is lower than a resolution of each time-interleaved ADC.

Another aspect of the invention is directed to a time-interleaved circuit comprising K time-interleaved ADCs; N sampling circuits, each sampling circuit having an input electrically coupled to an input line having an input voltage, the N sampling circuits configured to sample the input voltage at respective sampling times at a sampling frequency in a time-interleaved manner; a differentiator having an input electrically connected to the input line and producing, at an output of the differentiator, a differentiator output voltage that represents to a derivative of the input voltage with respect to time; a differentiator ADC having an input electrically connected to the output of the differentiator, the differentiator ADC configured to convert the differentiator output voltage to a digital differentiator output signal at the sampling frequency; a digital register coupled to an output of the differentiator ADC, the digital register configured to hold N digital differentiator output signals, the N digital differentiator output signals corresponding to the input voltage sampled by the N sampling circuits at the respective sampling times; and a sample-selection circuit operably coupled to the digital register, the sample-selection circuit including a respective input electrically connected to a respective output of each sampling circuit, and a respective output electrically connected to a respective input of each ADC. The sample-selection circuit is configured to determine K digital differentiator output signals having a lowest magnitude of the N digital differentiator output signals, and electrically couple only K sampling circuits to the K time-interleaved ADCs, the K sampling circuits corresponding to the K digital differentiator samples, wherein K is less than N, and K and N are positive integers greater than 1.

In one or more embodiments, the sample-selection circuit includes the digital register.

Another aspect of the invention is directed to a time-interleaved circuit comprising: a plurality of time-interleaved ADCs, each ADC having respective input sampling circuitry that is electrically coupled to an input line having an input voltage, the respective input sampling circuitry configured to sample the input voltage at respective sampling times and at a sampling frequency in a time-interleaved manner; a sample-selection circuit having a plurality of inputs, each input electrically connected to a respective output of each ADC; a differentiator having an input electrically connected to the input line and producing, at an output of the differentiator, a differentiator output voltage that corresponds to a derivative of the input voltage with respect to time; a first comparator having a first input electrically connected to the output of the differentiator and a second input electrically connected to a first threshold input line having a first threshold voltage, the first threshold voltage having a threshold magnitude and a positive polarity, the first comparator producing a first-comparator output voltage at an output of the first comparator; a second comparator having a first input electrically connected to the output of the differentiator and a second input electrically connected to a second threshold input line having a second threshold voltage, the second threshold voltage having the threshold magnitude and a negative polarity, the second comparator producing a second-comparator output voltage at an output of the second comparator; and a logic circuit having a first input electrically connected to the output of the first comparator and a second input electrically connected to the output of the second comparator, the logic circuit configured to enable the respective channel for each ADC in which the differentiator output voltage at the respective sampling time for a respective ADC is between the first and second threshold voltages, and disable the respective channel for each ADC in which the differentiator output voltage at the respective sampling time is higher than the first threshold voltage or lower than the second threshold voltage.

Another aspect of the invention is directed to a circuit comprising an ADC having input sampling circuitry that is electrically coupled to an input line having an input voltage, the input sampling circuitry configured to sample the input voltage at sampling times and at a sampling frequency; a differentiator having an input electrically connected to the input line and producing, at an output of the differentiator, a differentiator output voltage that corresponds to a derivative of the input voltage with respect to time; a first comparator having a first input electrically connected to the output of the differentiator and a second input electrically connected to a first threshold input line having a first threshold voltage, the first threshold voltage having a threshold magnitude and a positive polarity, the first comparator producing a first-comparator output voltage at an output of the first comparator; a second comparator having a first input electrically connected to the output of the differentiator and a second input electrically connected to a second threshold input line having a second threshold voltage, the second threshold voltage having the threshold magnitude and a negative polarity, the second comparator producing a second-comparator output voltage at an output of the second comparator; and a logic circuit having a first input electrically connected to the output of the first comparator and a second input electrically connected to the output of the second comparator, the logic circuit configured to enable the ADC when the differentiator output voltage, at a sampling time of the ADC, is between the first and second threshold voltages, and disable the ADC when the differentiator output voltage, at the sampling time of the ADC, is higher than the first threshold voltage or lower than the second threshold voltage.

Another aspect of the invention is directed to a time-interleaved circuit comprising a plurality of time-interleaved ADCs, each ADC having respective input sampling circuitry that is electrically coupled to an input line having an input voltage, the respective input sampling circuitry configured to sample the input voltage at respective sampling times and at a sampling frequency in a time-interleaved manner; a differentiator having an input electrically connected to the input line and producing, at an output of the differentiator, a differentiator output voltage that corresponds to a derivative of the input voltage with respect to time; a differentiator ADC having an input electrically connected to the output of the differentiator, the differentiator ADC configured to convert the differentiator output voltage to a digital differentiator output signal; and a sample-selection circuit having a first input electrically connected to an output of the differentiator ADC and a plurality of second inputs, each second input electrically connected to a respective output of each ADC, wherein the sample-selection circuit is configured to enable a respective channel for each ADC in which a magnitude of the digital differentiator output signal at the respective sampling time for a respective ADC is lower than a predetermined digital threshold, and disable the respective channel for each ADC in which the magnitude of the digital differentiator output signal at the respective sampling time for the respective ADC is higher than or equal to the predetermined digital threshold.

Another aspect of the invention is directed to a circuit comprising a primary ADC having input sampling circuitry that is electrically coupled to an input line having an input voltage, the input sampling circuitry configured to sample the input voltage at a sampling frequency; a differentiator having an input electrically connected to the input line and producing, at an output of the differentiator, a differentiator output voltage that corresponds to a derivative of the input voltage with respect to time; a differentiator ADC having an input electrically connected to the output of the differentiator, the differentiator ADC configured to convert the differentiator output voltage to a digital differentiator output signal; and a sample-selection circuit having a first input electrically connected to an output of the differentiator ADC and a second input electrically connected to an output of the primary ADC, wherein the sample-selection circuit is configured to enable the primary ADC when the digital differentiator output signal, at a sampling time for the primary ADC, is lower than a predetermined digital threshold, and disable the primary ADC when the digital differentiator output signal, at the sampling time for the primary ADC, is higher than or equal to the predetermined digital threshold.

Another aspect of the invention is directed to a time-interleaved circuit comprising a differentiator having an input electrically connected to an input line having an input voltage, the differentiator producing, at an output of the differentiator, a differentiator output voltage that corresponds to a derivative of the input voltage with respect to time; a plurality of time-interleaved first sampling circuits, each first sampling circuit having an input electrically coupled to the input line, the first sampling circuits configured to sample the input voltage at respective sampling times and at a sampling frequency in a time-interleaved manner; a plurality of switches, each switch having a respective first state in which a respective switch is electrically connected to an output of a respective first sampling circuit and a respective second state in which the respective switch is electrically connected to the output of the differentiator; and a plurality of pipeline ADCs, each pipeline ADC comprising a respective second sampling circuit having an input electrically connected to the output of a respective first sampling circuit; a respective sub ADC having an input electrically connected to the respective switch; a respective sub digital-to-analog converter (DAC) having an input electrically connected to an output of the respective sub ADC; a respective interstage amplifier having a first input electrically connected to an output of the respective sub DAC and a second input electrically connected to an output of the respective second sampling circuit; a respective backend ADC having an input electrically connected to an output of the respective interstage amplifier; and a respective logic circuit having an input electrically connected to the output of the respective sub ADC and an output electrically coupled to the respective DAC, to the respective interstage amplifier, and/or to the respective backend ADC. For each pipeline ADC: at a respective first time ($t_0$), the respective first sampling circuit samples and holds a respective sampled input voltage, the respective second sampling circuit tracks the respective sampled input voltage at the output of the respective first sampling circuit, the respective switch transitions from the respective first state to the respective second state, and the respective sub ADC holds and converts the differentiator output voltage to a respective digital differentiator output signal, at a respective second time ($t_1$), the respective sub ADC tracks the output of the respective first sampling circuit, at a respective third time ($t_2$), the respective first sampling circuit tracks the input voltage, the respective second sampling circuit holds the respective sampled input voltage at the output of the respective first sampling circuit, the respective switch transitions from the respective second state to the respective first state, and the respective sub ADC holds and converts the respective sampled input voltage at the output of the respective first sampling circuit, the respective logic circuit is configured to enable the respective DAC, the respective interstage amplifier, and/or the respective backend ADC to process the respective sampled input voltage when a magnitude of the respective digital differentiator output signal is below a predetermined digital threshold, the respective logic circuit is configured to disable the respective DAC, the respective interstage amplifier, and/or the backend ADC when the magnitude of the respective digital differentiator output signal is higher than or equal to the predetermined digital threshold, and $t_0<t_1<t_2$.

Another aspect of the invention is directed to a circuit comprising a differentiator having an input electrically connected to an input line having an input voltage, the differentiator producing, at an output of the differentiator, a differentiator output voltage that corresponds to a derivative of the input voltage with respect to time; a first sampling circuit having an input electrically coupled to the input line, the first sampling circuit configured to sample the input voltage at sampling times and at a sampling frequency; a switch having a first state in which the switch is electrically connected to an output of the first sampling circuit and a second state in which the switch is electrically connected to the output of the differentiator; and a pipeline ADC comprising a second sampling circuit having an input electrically connected to the output of the first sampling circuit; a sub ADC having an input electrically connected to the switch; a sub DAC having an input electrically connected to an output of the sub ADC; an interstage amplifier having a first input electrically connected to an output of the sub DAC and a second input electrically connected to an output of the second sampling circuit; a backend ADC having an input electrically connected to an output of the respective interstage amplifier; and a logic circuit having an input electrically connected to the output of the sub ADC and an output electrically coupled to the DAC, to the interstage amplifier, and/or to the backend ADC, wherein: at a first time ($t_0$), the first sampling circuit samples and holds a sampled input voltage, the second sampling circuit tracks the sampled input voltage at the output of the first sampling circuit, the switch transitions from the first state to the second state, and the sub ADC holds and converts the differentiator output voltage to a digital differentiator output signal, at a second time ($t_1$), the sub ADC tracks the output of the first sampling circuit, at a third time ($t_2$), the first sampling circuit tracks the input voltage, the second sampling circuit holds the sampled input voltage at the output of the first sampling circuit, the switch transitions from the second state to the first state, and the sub ADC holds and converts the sampled input voltage at the output of the first sampling circuit, the logic circuit is configured to enable the DAC, the interstage amplifier, and/or the ADC to process the sampled input voltage when a magnitude of the respective digital differentiator output signal is below a predetermined digital threshold, the logic circuit is configured to disable the DAC, the interstage amplifier, and/or the backend ADC when the magnitude of the digital differentiator output signal is higher than or equal to the predetermined digital threshold, and $t_0<t_1<t_2$.

Another aspect of the invention is directed to a time-interleaved circuit comprising a differentiator having an input electrically connected to an input line having an input voltage, the differentiator producing, at an output of the differentiator, a differentiator output voltage that corresponds to a derivative of the input voltage with respect to time; a plurality of time-interleaved sampling circuits, each sampling circuit having an input electrically coupled to the input line, the sampling circuits configured to sample the input voltage at respective sampling times and at a sampling frequency in a time-interleaved manner; a plurality of switches, each switch having a respective first state in which a respective switch is electrically connected to an output of a respective sampling circuit and a respective second state in which the respective switch is electrically connected to the output of the differentiator; and a plurality of pipeline ADCs, each pipeline ADC comprising a respective sub ADC having an input electrically connected to the respective switch; a respective sub DAC having an input electrically connected to an output of the respective sub ADC; a respective interstage amplifier having a first input electrically connected to an output of the respective sub DAC and a second input electrically connected to an output of the respective sampling circuit; a respective backend ADC having an input electrically connected to an output of the respective interstage amplifier; and a respective logic circuit having an input electrically connected to the output of the respective sub ADC and an output electrically coupled to the respective DAC, to the respective interstage amplifier, and/or to the respective backend ADC, wherein for each pipeline ADC: at a respective first time ($t_0$), the respective sampling circuit tracks the input voltage, the respective switch transitions from the respective first state to the respective second state, and the respective sub ADC tracks the differentiator output voltage, at a respective second time ($t_1$), the respective sampling circuit samples and holds a respective sampled input voltage, the respective switch transitions from the respective second state to the respective first state, and the respective sub ADC holds and converts the differentiator output voltage to a respective digital differentiator output signal, at a respective third time ($t_2$), the respective sampling circuit continues to hold the respective sampled input voltage, the respective switch is in the respective first state, and the respective sub ADC tracks the respective sampled input voltage at the output of the respective sampling circuit, at a respective fourth time ($t_3$), the respective sampling circuit continues to hold the respective sampled input voltage, the respective switch is in the respective first state, and the respective sub ADC holds and converts the respective sampled input voltage at the output of the respective sampling circuit, the respective logic circuit is configured to enable the respective DAC, the respective interstage amplifier, and/or the respective backend ADC to process the respective sampled input voltage when a magnitude of the respective digital differentiator output signal is below a predetermined digital threshold, the respective logic circuit is configured to disable the respective DAC, the respective interstage amplifier, and/or the backend ADC when the magnitude of the respective digital differentiator output signal is higher than or equal to the predetermined digital threshold, and $t_0<t_1<t_2<t_3$.

Another aspect of the invention is directed to a circuit comprising: a differentiator having an input electrically connected to an input line having an input voltage, the differentiator producing, at an output of the differentiator, a differentiator output voltage that corresponds to a derivative of the input voltage with respect to time; a sampling circuit having an input electrically coupled to the input line, the sampling circuit configured to sample the input voltage at sampling times and at a sampling frequency; a switch having a first state in which the switch is electrically connected to an output of the sampling circuit and a second state in which the switch is electrically connected to the output of the differentiator; and a pipeline ADC comprising a sub ADC having an input electrically connected to the switch; a sub DAC having an input electrically connected to an output of the sub ADC; an interstage amplifier having a first input electrically connected to an output of the sub DAC and a second input electrically connected to an output of the sampling circuit; a backend ADC having an input electrically connected to an output of the interstage amplifier; and a logic circuit having an input electrically connected to the output of the sub ADC and an output electrically coupled to the DAC, to the interstage amplifier, and/or to the backend ADC, wherein: at a first time ($t_0$), the sampling circuit tracks the input voltage, the switch transitions from the first state to the second state, and the sub ADC tracks the differentiator output voltage, at a second time ($t_1$), the sampling circuit samples and holds a sampled input voltage, the switch transitions from the second state to the first state, and the sub ADC holds and converts the differentiator output voltage to a digital differentiator output signal, at a third time ($t_2$), the sampling circuit continues to hold the sampled input voltage, the switch is in the first state, and the sub ADC tracks the sampled input voltage at the output of the sampling circuit, at a fourth time ($t_3$), the sampling circuit continues to hold the sampled input voltage, the switch is in the first state, and the sub ADC holds and converts the sampled input voltage at the output of the sampling circuit, the logic circuit is configured to enable the DAC, the interstage amplifier, and/or the backend ADC to process the sampled input voltage when a magnitude of the digital differentiator output signal is below a predetermined digital threshold, the logic circuit is configured to disable the DAC, the interstage amplifier, and/or the ADC when the magnitude of the digital differentiator output signal is higher than or equal to the predetermined digital threshold, and $t_0 < t_1 < t_2 < t_3$.

BRIEF DESCRIPTION OF THE DRAWINGS

For a fuller understanding of the nature and advantages of the concepts disclosed herein, reference is made to the detailed description of preferred embodiments and the accompanying drawings.

DETAILED DESCRIPTION

A derivative measurement circuit, such as a differentiator circuit, is configured to measure the time-derivative of the input voltage of an input line at sampling times. A plurality of time-interleaved analog-to-digital converters (ADCs) are electrically coupled to the input line to convert sampled input voltages to digital samples. A plurality of sampling circuits sample the input voltage at respective sampling times at a common sampling frequency in a time-interleaved manner. The sampling circuits can be separate circuits or they can be included in the ADCs (e.g., as in successive approximation (SAR) ADCs). When the magnitude of the time-derivative of the input voltage is high (or based on another algorithm such as relative rank of the time-derivate), the sampled input voltage is not digitized in an ADC to limit sampling clock jitter and sampling clock skew.

Figure 1A:
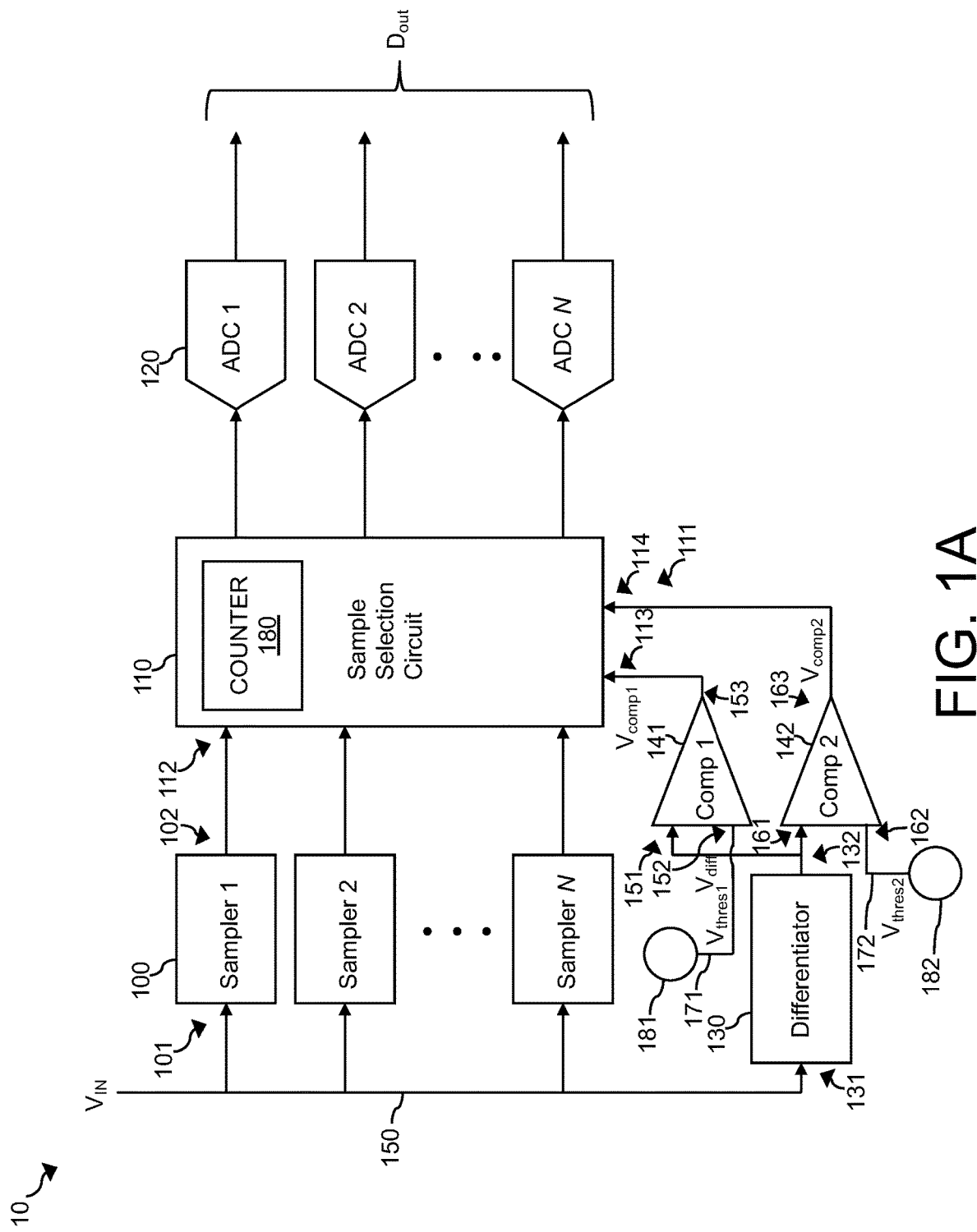
FIG. 1A is a diagram of a time-interleaved circuit according to an embodiment.

FIG. 1A is a circuit diagram of a time-interleaved circuit 10 according to an embodiment. The circuit 10 includes a plurality of time-interleaved sampling circuits 100, a sample-selection circuit 110, a plurality of time-interleaved analog-to-digital converters (ADCs) 120, a differentiator circuit 130, a first comparator 141, a second comparator 142, and an input line 150.

The sampling circuits 100 have respective inputs 101 that are electrically connected to the input line 150 that has an input voltage $V_{IN}$ that varies with respect to time. As such, the respective input 101 of each sampling circuit 100 is at the input voltage $V_{IN}$. The sampling circuits 100 sample the input voltage $V_{IN}$ at the same sampling frequency. The relative phase of the sampling frequency is offset between the sampling circuits 100 such that the sampling circuits 100 sample the input voltage $V_{IN}$ at different sampling times in a time-interleaved manner. In some embodiments, there can be N sampling circuits 100 where N is a positive integer greater than 1. In some embodiments, N can be greater than equal to 1 and less than or equal to 256, including any value or range therebetween. In other embodiments, N can be greater than 256, such as 257 to 512 or another value.

The sample-selection circuit 110 has at least one first input 111 that is electrically coupled to an output 132 of the differentiator 130 and a plurality of sampler inputs 112 that are electrically connected to the outputs 102 of the sampler circuits 100, respectively. There can be the same number of sampler inputs 112 as sampling circuits 100. For example, when there are N sampling circuits 100, the sample-selection circuit 110 can also include N sampler inputs 112.

The differentiator 130 has an input 131 that is electrically connected to the input line 150 such that the input 131 is at the input voltage $V_{IN}$. The differentiator 130 produces a differentiator output voltage $V_{diff}$ at the output 132 that corresponds and/or represents a derivative of the input voltage $V_{IN}$ with respect to time. In some embodiments, the differentiator 130 can be replaced with another derivative-measurement circuit. The differentiator 130 can be a continuous-time differentiator 130 or can be time-synchronized with the sampling circuits 100.

The output 132 of the differentiator 130 is electrically connected to respective first inputs 151, 161 of the first and second comparator 141, 142. The first and second comparators 141, 142 include respective second inputs 152, 162 that are electrically connected to first and second threshold input lines 171, 172, respectively. The first threshold input line 171 has a first threshold voltage $V_{thresh1}$ that can be produced by a first voltage source 181. The second threshold input line 172 has a second threshold voltage $V_{thresh2}$ that can be produced by a second voltage source 182. The first and second threshold voltages $V_{thresh1}$, $V_{thresh2}$ have the same (or approximately the same, such as within about 5%) magnitude and are opposite in polarity. For example, the first threshold voltage $V_{thresh1}$ can have a positive polarity and the second threshold voltage $V_{thresh2}$ can have a negative polarity. Conversely, the first threshold voltage $V_{thresh1}$ can have a negative polarity and the second threshold voltage $V_{thresh2}$ can have a positive polarity.

The first comparator 141 produces a first-comparator output voltage $V_{comp1}$ that corresponds and/or represents the difference between the first threshold voltage $V_{thresh1}$ and the differentiator output voltage $V_{diff}$. The second comparator 142 produces a second-comparator output voltage $V_{comp2}$ that corresponds and/or represents the difference between the second threshold voltage $V_{thresh2}$ and the differentiator output voltage $V_{diff}$. The first and second comparators 141, 142 can operate at an aggregate sampling frequency $Nf_s$ where $f_s$ is the sampling frequency of each sampling circuit 100.

Figure 1B:
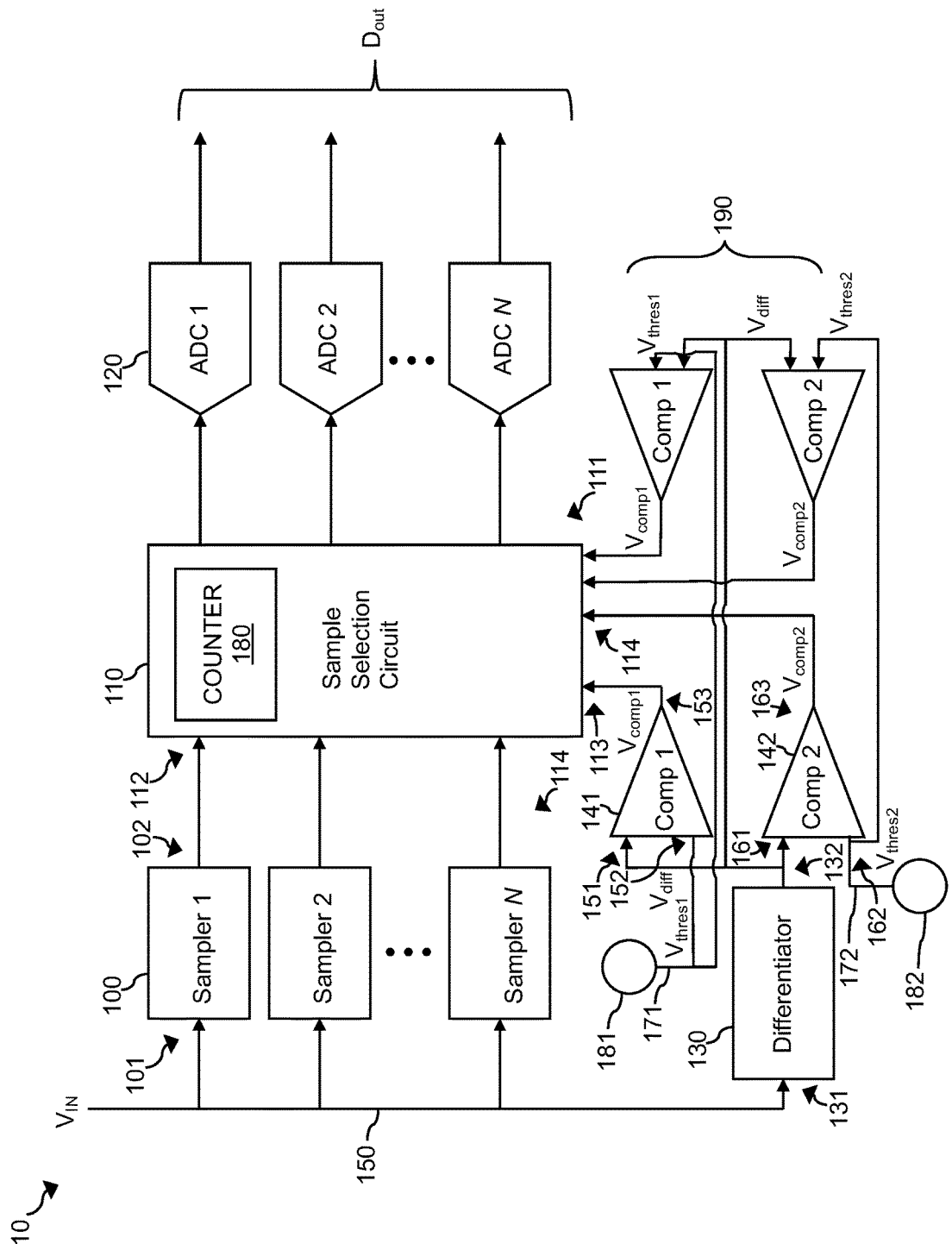
FIG. 1B is a diagram of a time-interleaved circuit according to another embodiment.

In some embodiments, the circuit 10 can include a plurality (M) of sets 190 of first and second comparators 141, 142, where the outputs of the first and second comparators 141, 142 of each set 190 are electrically connected to respective inputs of the sample-selection circuit 110, as illustrated in FIG. 1B. The M sets 190 of first and second comparators 141, 142 can operate in time-interleaved fashion at an aggregate sampling frequency of $Nf_s/M$. M is a positive integer that is less than or equal to N.

The sample-selection circuit 110 can include first and second comparator inputs 113, 114 that are electrically connected to the outputs 153, 163 of the first and second comparators 141, 142, respectively. The first comparator input 113 is at the first-comparator output voltage $V_{comp1}$. The second comparator input 114 is at the second-comparator output voltage $V_{comp2}$.

The sample-selection circuit 110 is configured to electrically couple a sampling circuit 100 to a respective (e.g., next-available) ADC 120 (e.g., in a time-interleaved fashion) when the magnitude of the differentiator output voltage $V_{diff}$ at the sampling time of the sampling circuit 100 is lower than a threshold magnitude. The sample-selection circuit 110 can determine whether the differentiator output voltage $V_{diff}$ is between the first and second threshold voltages $V_{thresh1}$, $V_{thresh2}$ using the values of the first-comparator and second-comparator output voltages $V_{comp1}$, $V_{comp2}$.

When the magnitude of the differentiator output voltage $V_{diff}$ at the sampling time for a given sampling circuit 100 is below the threshold magnitude, the sampled input voltage $V_{IN}$ is kept and sent to a respective (e.g., next-available) ADC 120 for digital conversion. When the magnitude of the differentiator output voltage $V_{diff}$ at the sampling time for a given sampling circuit 100 is greater than or equal to the threshold magnitude for a given sampling circuit 100, the sampled input voltage $V_{IN}$ is discarded and not sent to a respective ADC 120 for digital conversion. The respective ADC 120 may be disabled to save power. Thus, only sampled input voltages $V_{IN}$ that are taken at respective times when the time-differential of the input voltage $V_{IN}$, as represented by the differentiator output voltage $V_{diff}$, is below a threshold magnitude are routed for conversion by the ADCs 120. There can be the same number (N) of ADCs 120 as sampling circuits 100. In some embodiments, the number of ADCs can be lower than the number of sampling circuits 100.

The output of the ADCs 120 is a digital signal $D_{out}$ that is a digital version of the sampled input voltage $V_{IN}$.

In some embodiments, a counter circuit 180 can be embedded in the sample-selection circuit 110 to determine whether the average rate of sampled input voltages $V_{IN}$ is greater than or equal to the Nyquist sampling rate. The counter circuit 180 counts the number of sampled input voltage $V_{IN}$ sent to a respective ADC in a given period of time. The counter circuit 180 can be electrically coupled to the sample-selection circuit 110 as feedback to adjust (e.g., increase) the number of sampled input voltages $V_{IN}$, if necessary. Additionally or alternatively, the counter circuit 180 can be electrically coupled to the voltage sources 181, 182 that supply the first and second threshold voltages $V_{thresh1}$, $V_{thresh2}$, respectively, so as to adjust the first and second threshold voltages $V_{thresh1}$, $V_{thresh2}$ to indirectly adjust (e.g., increase) the number of sampled input voltages $V_{IN}$, if necessary.

The circuit 10 has the advantage of only digitizing the sampled input voltages $V_{IN}$ with time-differential values that are within the bounds of the first and second threshold voltages $V_{thresh1}$, $V_{thresh2}$ to thereby reduce the magnitude of the error caused by sampling clock jitter and skew.

Figure 2:
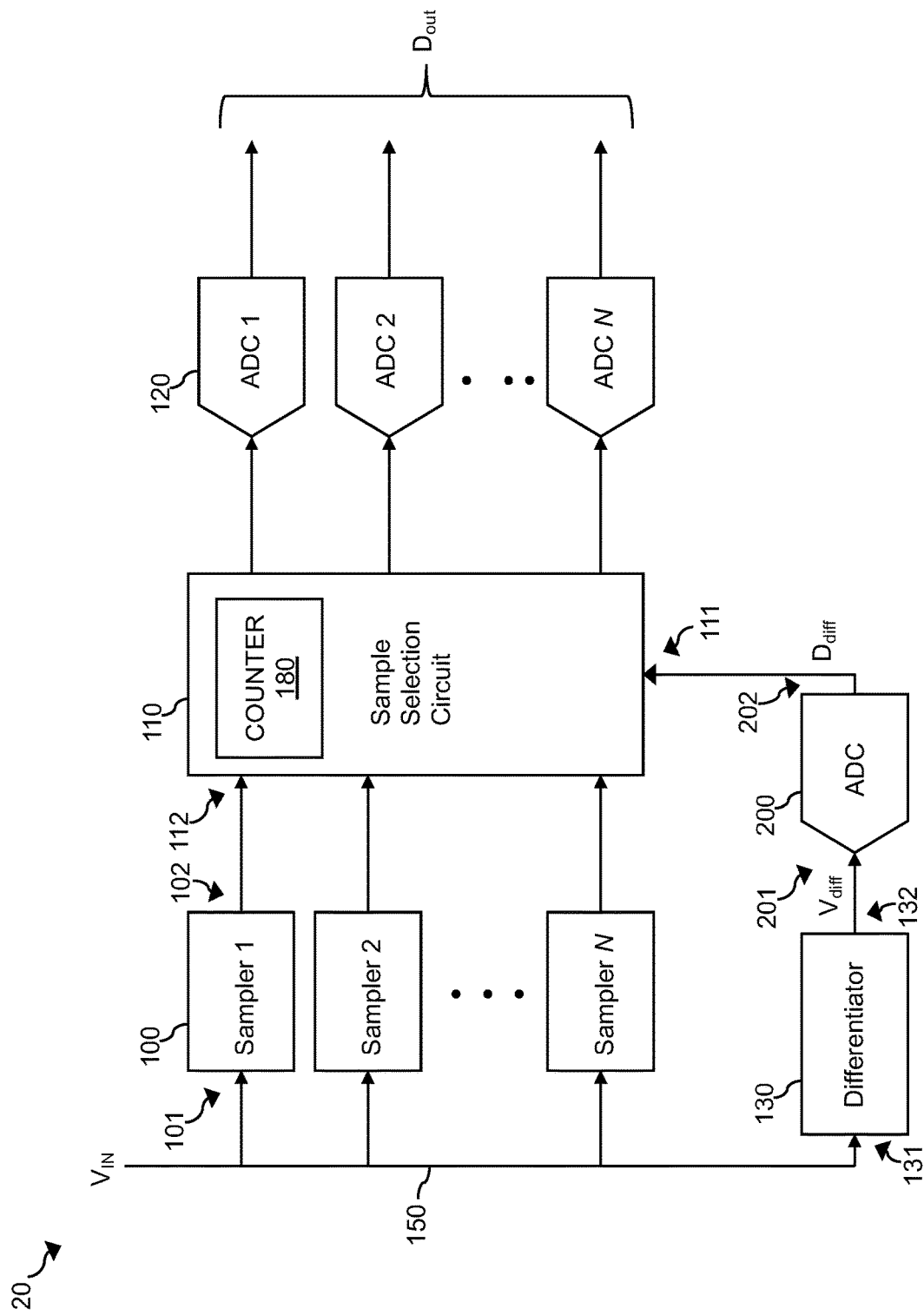
FIG. 2 is a diagram of a time-interleaved circuit according to another embodiment.

FIG. 2 is a circuit diagram of a time-interleaved circuit 20 according to another embodiment. The circuit 20 is the same as the circuit 10 except that in the circuit 20, the output 132 of the differentiator 130 is electrically coupled to an input 201 of a differentiator ADC 200. The differentiator ADC 200 converts (e.g., digitizes) the differentiator output voltage $V_{diff}$ to a digital differentiator output signal $D_{diff}$. An output 202 of the differentiator ADC 200 is electrically connected to the first input 111 of the sample-selection circuit 110. The differentiator ADC 200 can operate at an aggregate sampling frequency $Nf_s$, where $f_s$ is the sampling frequency of each sampling circuit 100.

The differentiator ADC 200 can have a lower resolution than the ADCs 120. For example, the differentiator ADC 200 can have 3-4 bits of resolution and the ADCs can have 10-12 bits of resolution.

The sample-selection circuit 110 is configured to electrically couple a sampling circuit 100 to a corresponding ADC 120 (e.g., in a time-interleaved fashion) when the magnitude of the digital differentiator output signal $D_{diff}$ at the sampling time of the sampling circuit 100 is lower than a threshold digital value $D_{th}$. When the magnitude of the digital differentiator output signal $D_{diff}$ at the sampling time for a given sampling circuit 100 is below the threshold digital value $D_{th}$, corresponding ADC 120 is enabled for digital conversion. When the magnitude of the digital differentiator output signal $D_{diff}$ at the sampling time for a given sampling circuit 100 is greater than or equal to the threshold digital value $D_{th}$ for a given sampling circuit 100, the corresponding ADC 120 is disabled. Thus, only sampled input voltages $V_{IN}$ that are taken at respective times when the time-differential of the input voltage $V_{IN}$, as represented by the digital differentiator output signal $D_{diff}$, is below the threshold digital value $D_{th}$, are routed for conversion by the ADCs 120.

In some embodiments, a counter circuit 180 can be embedded in the sample-selection circuit 110 to ensure that the average rate of sampled input voltages $V_{IN}$ is greater than or equal to the Nyquist sampling rate, as discussed above. For example, the counter circuit 180 can increase the number of ADCs 120 that are enabled to increase the sampling rate, if necessary. Additionally or alternatively, the counter circuit 180 can adjust the threshold digital value $D_{th}$ to indirectly adjust (e.g., increase) the number of sampled input voltages $V_{IN}$, if necessary.

The circuit 20 has the advantage of only digitizing the sampled input voltages $V_{IN}$ with time-differential values having a magnitude below a threshold magnitude to thereby reduce the magnitude of the error caused by sampling clock jitter and skew.

Figure 3:
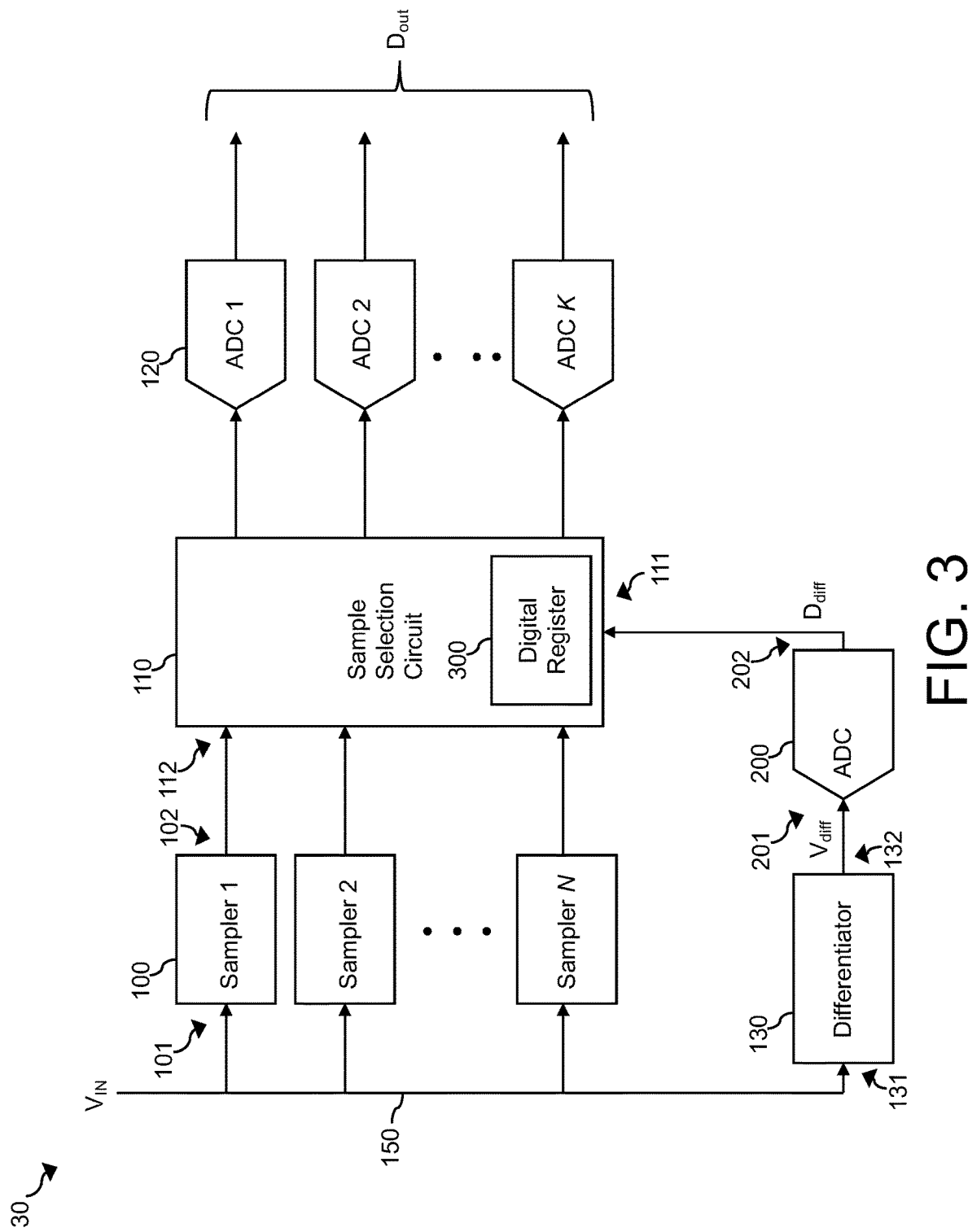
FIG. 3 is a diagram of a time-interleaved circuit according to another embodiment.

FIG. 3 is a circuit diagram of a time-interleaved circuit 30 according to another embodiment. The circuit 30 is the same as the circuit 20 except that in the circuit 30, the sample-selection circuit 110 includes a digital register 300. The digital register 300 is configured to hold a predetermined number N digital differentiator output signals $D_{diff}$ that represent a predetermined number N time-differentials of input voltages $V_{IN}$ sampled by the differentiator 130. When the predetermined number N of time-differentials of input voltages $V_{IN}$ sampled by the differentiator 130 are taken (e.g., when the digital register 300 is full), the sample-selection circuit 110 is configured to determine a predetermined number K lowest-magnitude digital differentiator output signals $D_{diff}$ out of the N digital differentiator output signals $D_{diff}$ stored in the digital register 300. In an embodiment, K is a positive integer greater than or equal to 1 and less than or equal to N. In another embodiment, K is a positive integer greater than 1 and less than N.

For each of the K lowest-magnitude digital differentiator output signals $D_{diff}$, the sample-selection circuit 110 electrically couples a corresponding sampling circuit 100 having the same sample time as the respective K lowest-magnitude digital differentiator output signal $D_{diff}$ to a respective ADC 120, such that all K ADCs 120 are used to digitize the sampled of input voltages $V_{IN}$.

The circuit 30 has the advantage of avoiding digitizing the sampled input voltages $V_{IN}$ with the highest time-differential values to reduce the magnitude of the error caused by sampling clock jitter and skew.

Figure 4:
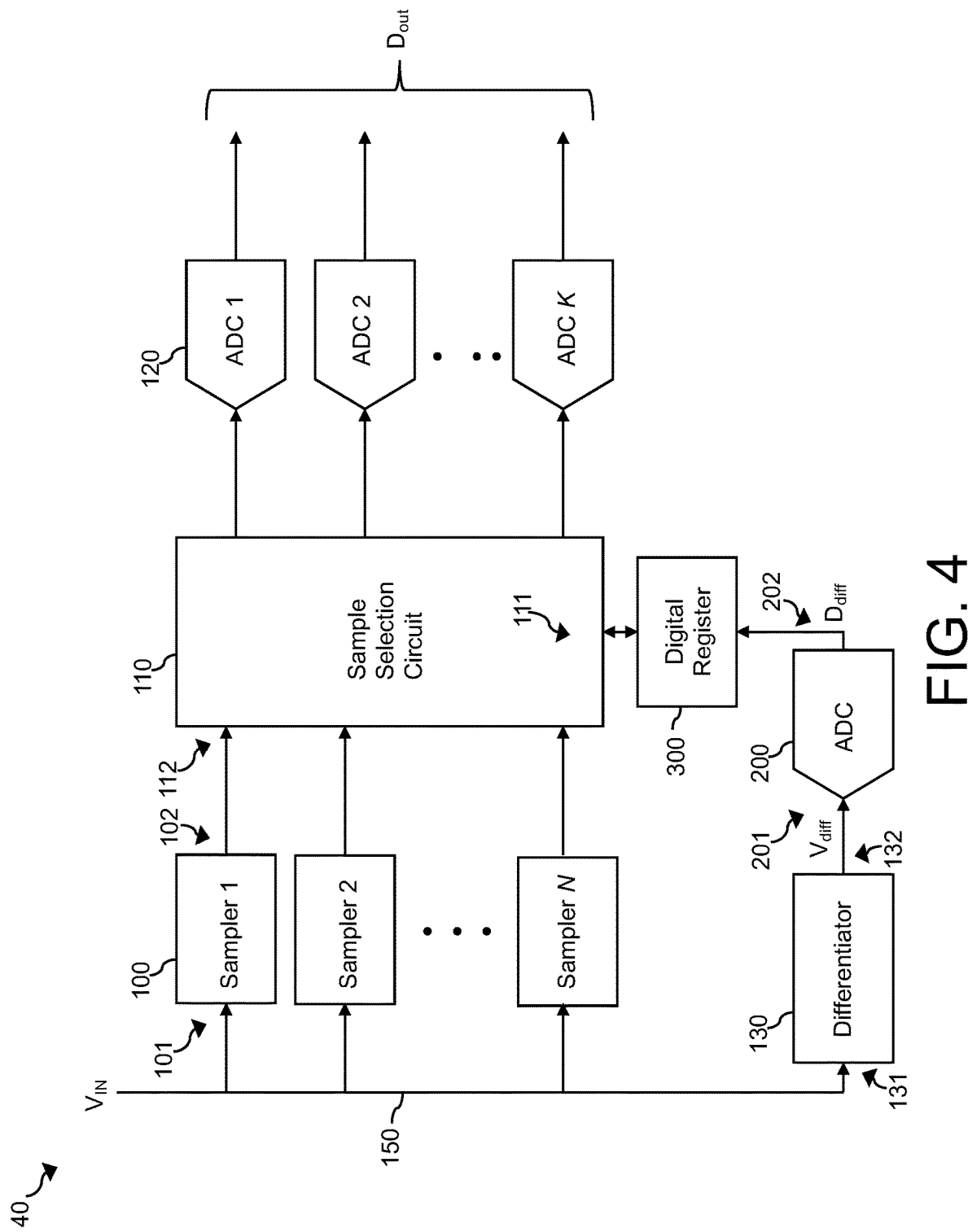
FIG. 4 is a diagram of a time-interleaved circuit according to another embodiment.

FIG. 4 is a circuit diagram of a time-interleaved circuit 40 according to another embodiment. The circuit 40 is the same as the circuit 30 except that in the circuit 40 the digital register 300 is located outside of the sample-selection circuit 110. The digital register 300 has an input that is electrically coupled to the output 202 of the differentiator ADC 200. An output of the digital register 300 is electrically coupled to the first input 111 of the sample-selection circuit 110.

Figure 5A:
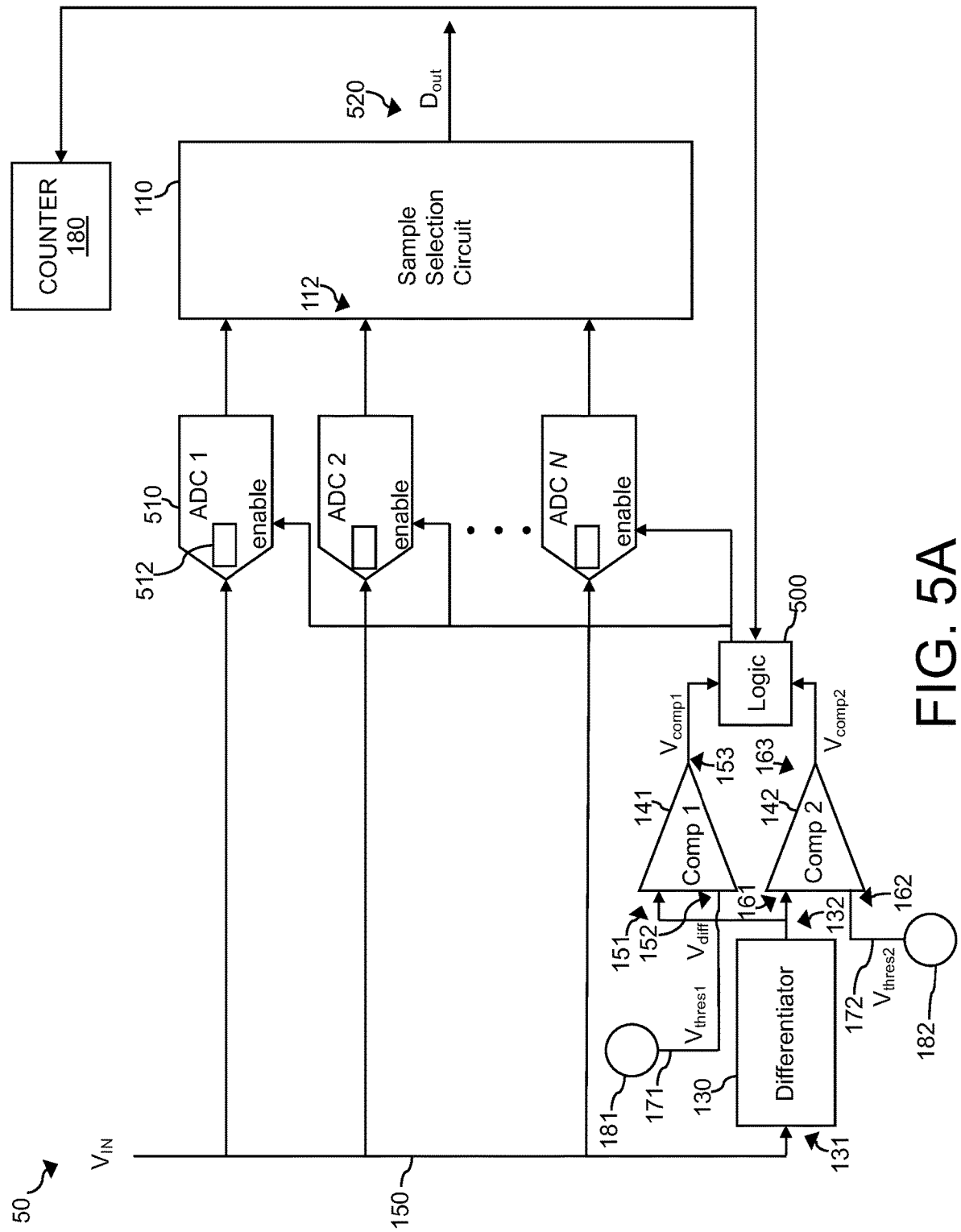
FIG. 5A is a diagram of a time-interleaved circuit according to another embodiment.

FIG. 5A is a circuit diagram of a time-interleaved circuit 50 according to another embodiment. In circuit 50, a logic circuit 500 has a first input that is electrically connected to the output 153 of the first comparator 141 and a second input that is electrically connected to the output 163 of the second comparator 142 to receive the first-comparator and second-comparator output voltages $V_{comp1}$, $V_{comp2}$, respectively, from the respective first and second voltage sources 181, 182. The logic circuit 500 is configured to determine whether the differentiator output voltage $V_{diff}$ for a respective sampled input voltage $V_{IN}$ by the differentiator 130, is between the first and second threshold voltages $V_{thresh1}$, $V_{thresh2}$ using the values of the first-comparator and second-comparator output voltages $V_{comp1}$, $V_{comp2}$. The first and second comparators 141, 142 can operate at an aggregate sampling frequency $Nf_s$ where $f_s$ is the sampling frequency of each sampling circuit 100.

Figure 5B:
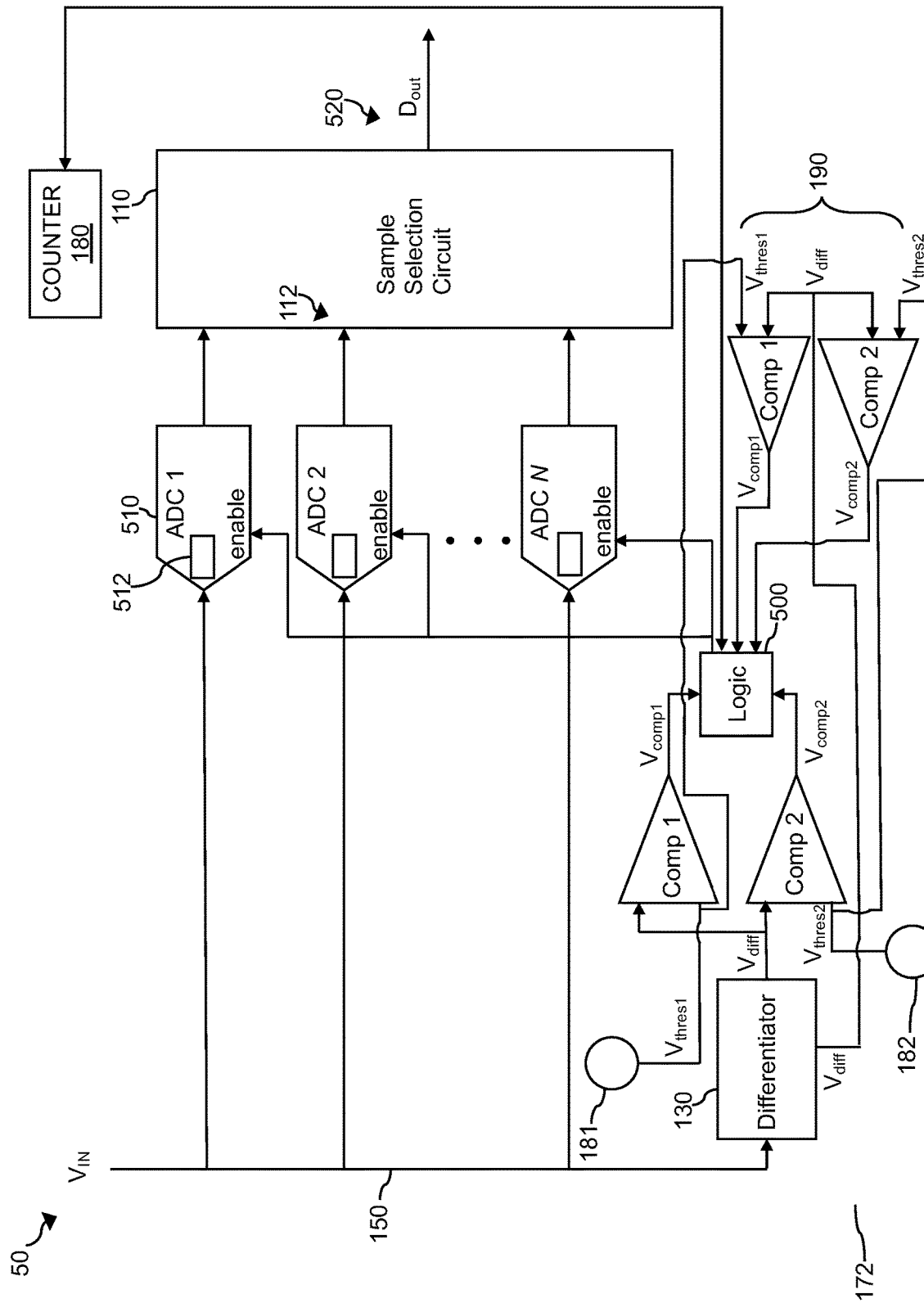
FIG. 5B is a diagram of a time-interleaved circuit according to another embodiment.

In some embodiments, the circuit 50 can include M sets 190 of first and second comparators 141, 142, where the outputs of the first and second comparators 141, 142 of each set 190 are electrically connected to respective inputs of the logic circuit 500, as illustrated in FIG. 5B. The M sets 190 of first and second comparators 141, 142 can operate in time-interleaved fashion at an aggregate sampling frequency of $Nf_s/M$.

For each differentiator output voltage $V_{diff}$ corresponding to a respective sampled input voltage $V_{IN}$ by the differentiator 130, that is between the first and second threshold voltages $V_{thresh1}$, $V_{thresh2}$, the logic circuit 500 is configured to enable the channel of the respective ADC 510 that has the same sampling time as the respective sampled input voltage $V_{IN}$ by the differentiator 130. For each differentiator output voltage $V_{diff}$ corresponding to a respective sampled input voltage $V_{IN}$ by the differentiator 130, that is higher than the first threshold voltage $V_{thresh1}$ (when the first threshold voltage $V_{thresh1}$ has a positive polarity) or lower than the second threshold voltage $V_{thresh2}$ (when the second threshold voltage $V_{thresh2}$ has a negative polarity), the logic circuit 500 is configured to disable the channel of the respective ADC 510 that has the same sampling time as the respective sampled input voltage $V_{IN}$ by the differentiator 130. The disabled ADCs 510 can be powered down or kept in a standby condition to eliminate a power consumption penalty incurred by idling ADC channels.

Each ADC 510 has an internal sampling circuit 512 to sample the input voltage $V_{IN}$ at the appropriate time and a common sampling frequency in a time-interleaved manner. For example, each ADC 510 can be or comprise a success approximation (SAR) ADC, a pipeline ADC, a flash ADC, or a time-based ADC.

The inputs 112 of the sample-selection circuit 110 are electrically connected to the respective outputs of the ADCs 510. The sample-selection circuit 110 can function as a multiplexer to electrically connect the ADCs 510 to a common digital output 520.

The circuit 50 can include a counter circuit 180 to ensure that the rate of sampled input voltages $V_{IN}$ is greater than or equal to the Nyquist sampling rate, as discussed above. The counter circuit 180 can be electrically coupled to the logic circuit 500 to determine the number of ADC channels enabled in a given period of time and as feedback to adjust the number of ADCs 510 enabled within a given time, if necessary. Additionally or alternatively, the counter circuit 180 can be electrically coupled to the voltage sources 181, 182 that supply the first and second threshold voltages $V_{thresh1}$, $V_{thresh2}$, respectively, so as to adjust the first and second threshold voltages $V_{thresh1}$, $V_{thresh2}$ to indirectly adjust (e.g., increase) the number of sampled input voltages $V_{IN}$, if necessary.

Figure 5C:
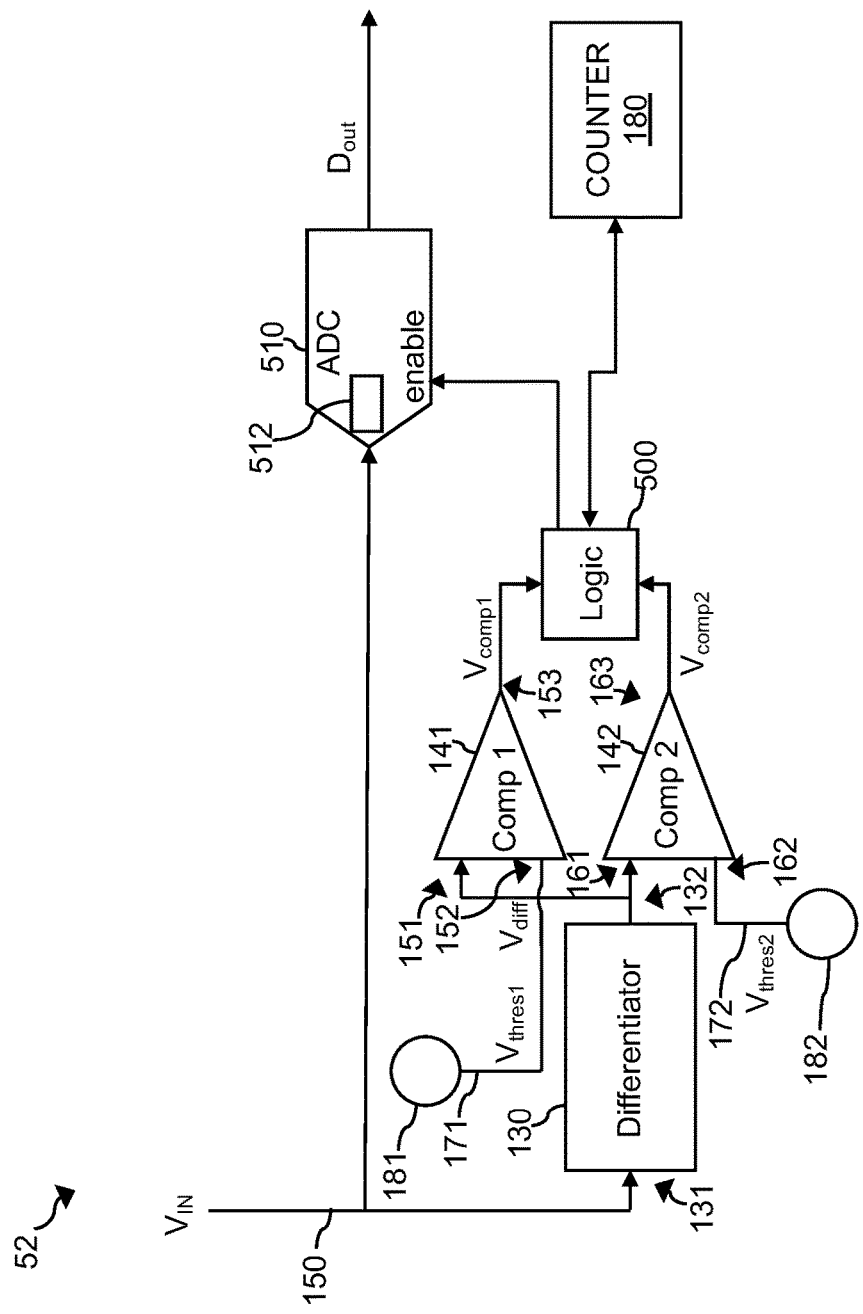
FIG. 5C is a diagram of a circuit according to another embodiment.

FIG. 5C is a circuit diagram of a circuit 52 according to another embodiment. The circuit 52 is the same as the time-interleaved circuit 50 illustrated in FIG. 5A except that circuit 52 only includes one ADC 510, which can be referred to as a primary ADC 510, and circuit 52 does not include a sample-selection circuit 110.

For each sampled differentiator output voltage $V_{diff}$ at the same sampling time of the primary ADC 510, that is between the first and second threshold voltages $V_{thresh1}$, $V_{thresh2}$, the logic circuit 500 enables the primary ADC 510. For each sampled differentiator output voltage $V_{diff}$ at the same sampling time of the primary ADC 510, that is higher than the first threshold voltage $V_{thresh1}$ (when the first threshold voltage $V_{thresh1}$ has a positive polarity) or lower than the second threshold voltage $V_{thresh2}$ (when the second threshold voltage $V_{thresh2}$ has a negative polarity), the logic circuit 500 disable the primary ADC 510.

The circuits 50, 52 have the advantage of only digitizing the sampled input voltages $V_{IN}$ with time-differential values that are within the bounds of the first and second threshold voltages $V_{thresh1}$, $V_{thresh2}$ to thereby reduce the magnitude of the error caused by sampling clock jitter and skew.

Figure 6A:
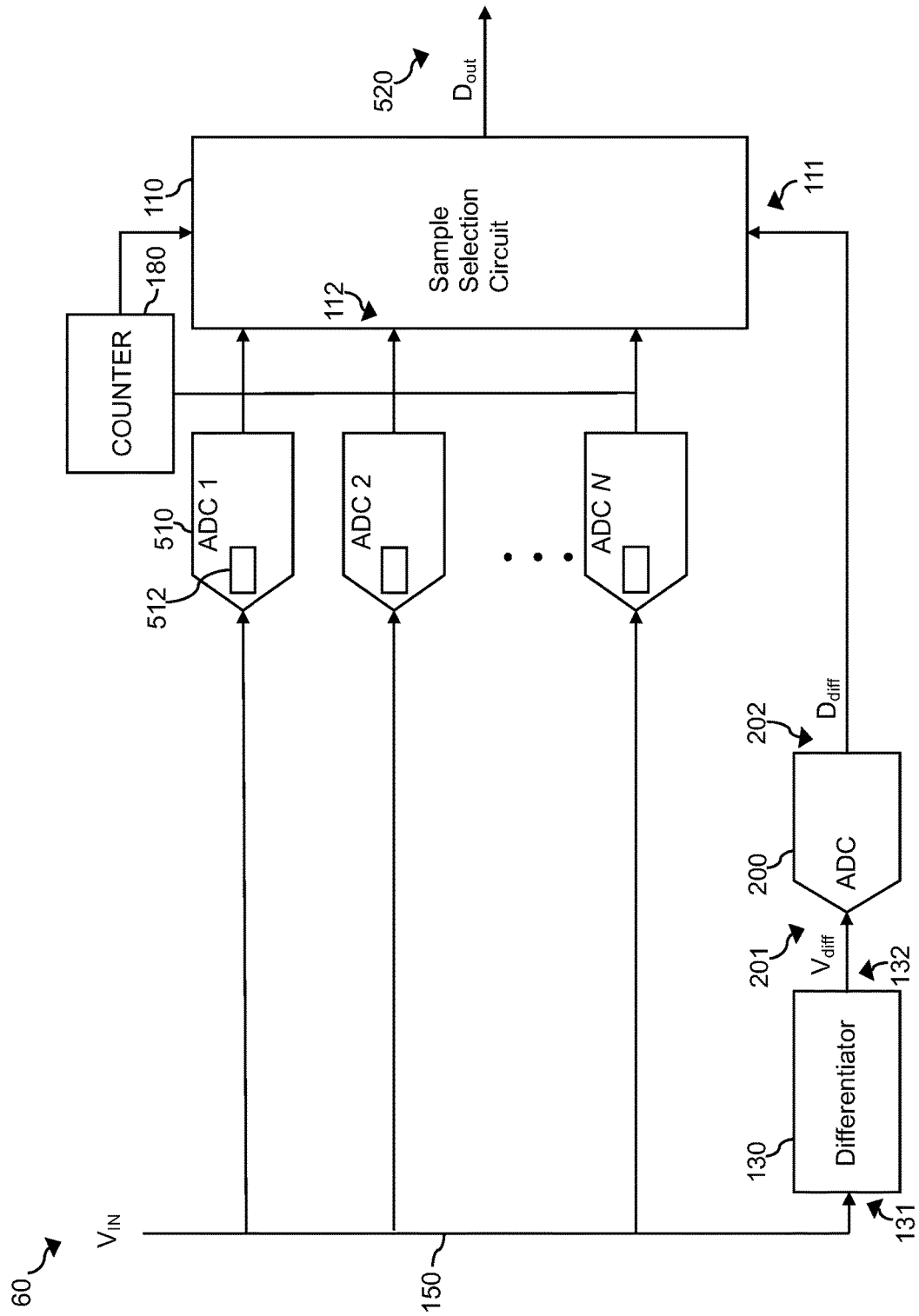
FIG. 6A is a diagram of a time-interleaved circuit according to another embodiment.

FIG. 6A is a circuit diagram of a time-interleaved circuit 60 according to another embodiment. In circuit 60, the sample-selection circuit 110 is configured to enable or disable each ADC 510 based on the magnitude of the digital differentiator output signal $D_{diff}$. For each digital differentiator output signal $D_{diff}$ corresponding to a respective sampled input voltage $V_{IN}$ by the differentiator 130, that has a magnitude lower than the threshold digital value $D_{th}$, the sample-selection circuit 110 is configured to enable the channel of the respective ADC 510 that has the same sampling time as the respective sampled input voltage $V_{IN}$ by the differentiator 130. For each digital differentiator output signal $D_{diff}$ corresponding to a respective sampled input voltage $V_{IN}$ by the differentiator 130, that has a magnitude higher than or equal to the threshold digital value $D_{th}$, the sample-selection circuit 110 is configured to disable the channel of the respective ADC 510 that has the same sampling time as the respective sampled input voltage $V_{IN}$ by the differentiator 130. The disabled ADCs 510 can be powered down or kept in a standby condition to eliminate a power consumption penalty incurred by idling AD channels.

The inputs 112 of the sample-selection circuit 110 are electrically connected to the respective outputs of the ADCs 510. The sample-selection circuit 110 can function as a multiplexer to electrically connect the ADCs 510 to a common digital output 520.

The circuit 60 can include a counter circuit 180 to ensure that the rate of sampled input voltages $V_{IN}$ is greater than or equal to the Nyquist sampling rate, as discussed above. The counter circuit 180 can be electrically coupled to the sample-selection circuit 110 as feedback to adjust the number of ADCs 510 enabled within a given time, if necessary.

Figure 6B:
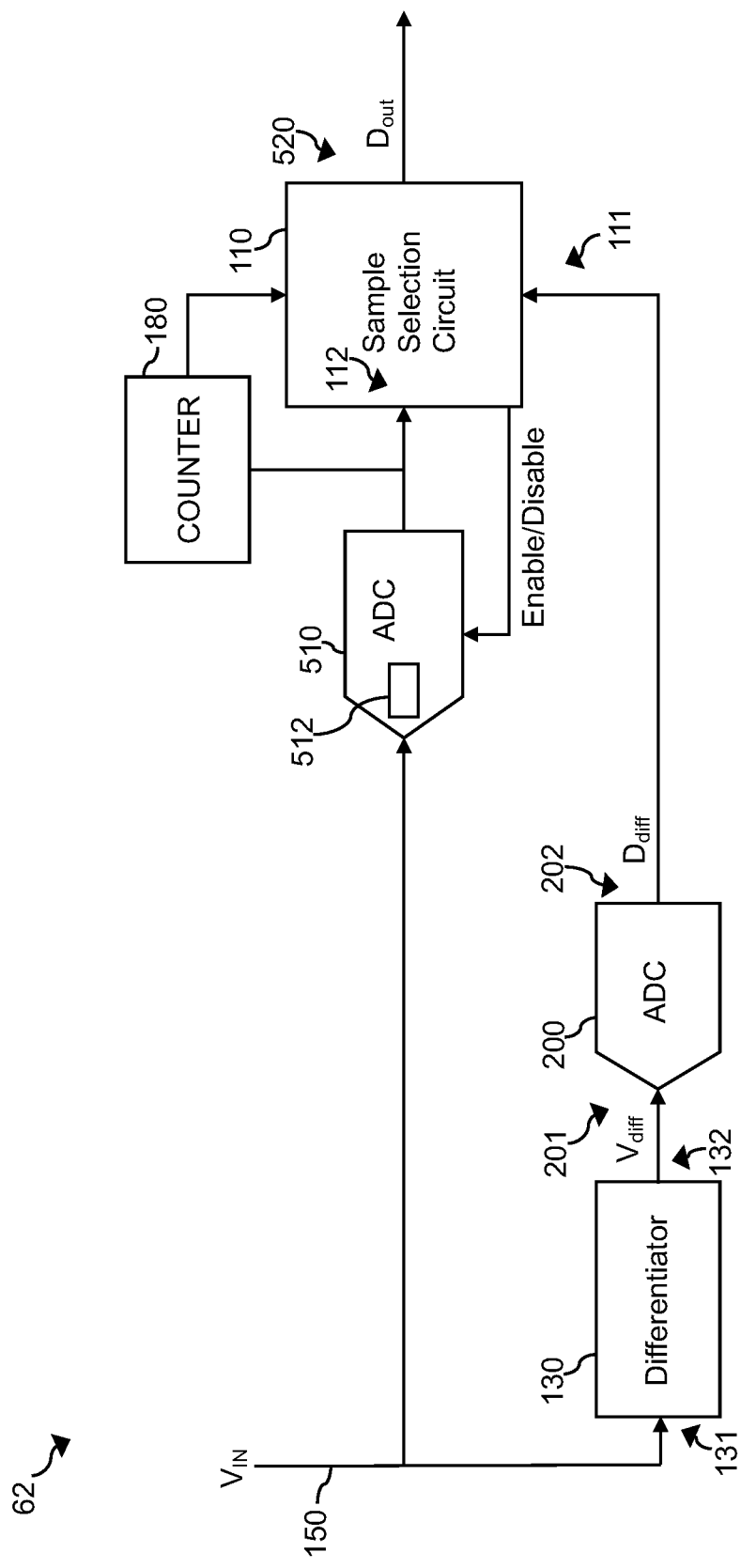
FIG. 6B is a diagram of a circuit according to another embodiment.

FIG. 6B is a circuit diagram of a circuit 62 according to another embodiment.

The circuit 62 is the same as the time-interleaved circuit 60 illustrated in FIG. 6A except that circuit 62 only includes one ADC 510, which can be referred to as a primary ADC 510.

For each digital differentiator output signal $D_{diff}$ corresponding to a respective sampled input voltage $V_{IN}$ by the differentiator 130 at the same sampling time of the primary ADC 510, that has a magnitude lower than the threshold digital value $D_{th}$, the sample-selection circuit 110 enables the primary ADC 510. For each digital differentiator output signal $D_{diff}$ corresponding to a respective sampled input voltage $V_{IN}$ by the differentiator 130 at the same sampling time of the primary ADC 510, that has a magnitude higher than or equal to the threshold digital value $D_{th}$, the sample-selection circuit 110 disables the primary ADC 510.

The circuits 60, 62 have the advantage of only digitizing the sampled input voltages $V_{IN}$ with time-differential values having a magnitude below a threshold magnitude to thereby reduce the magnitude of the error caused by sampling clock jitter and skew.

Figure 7:
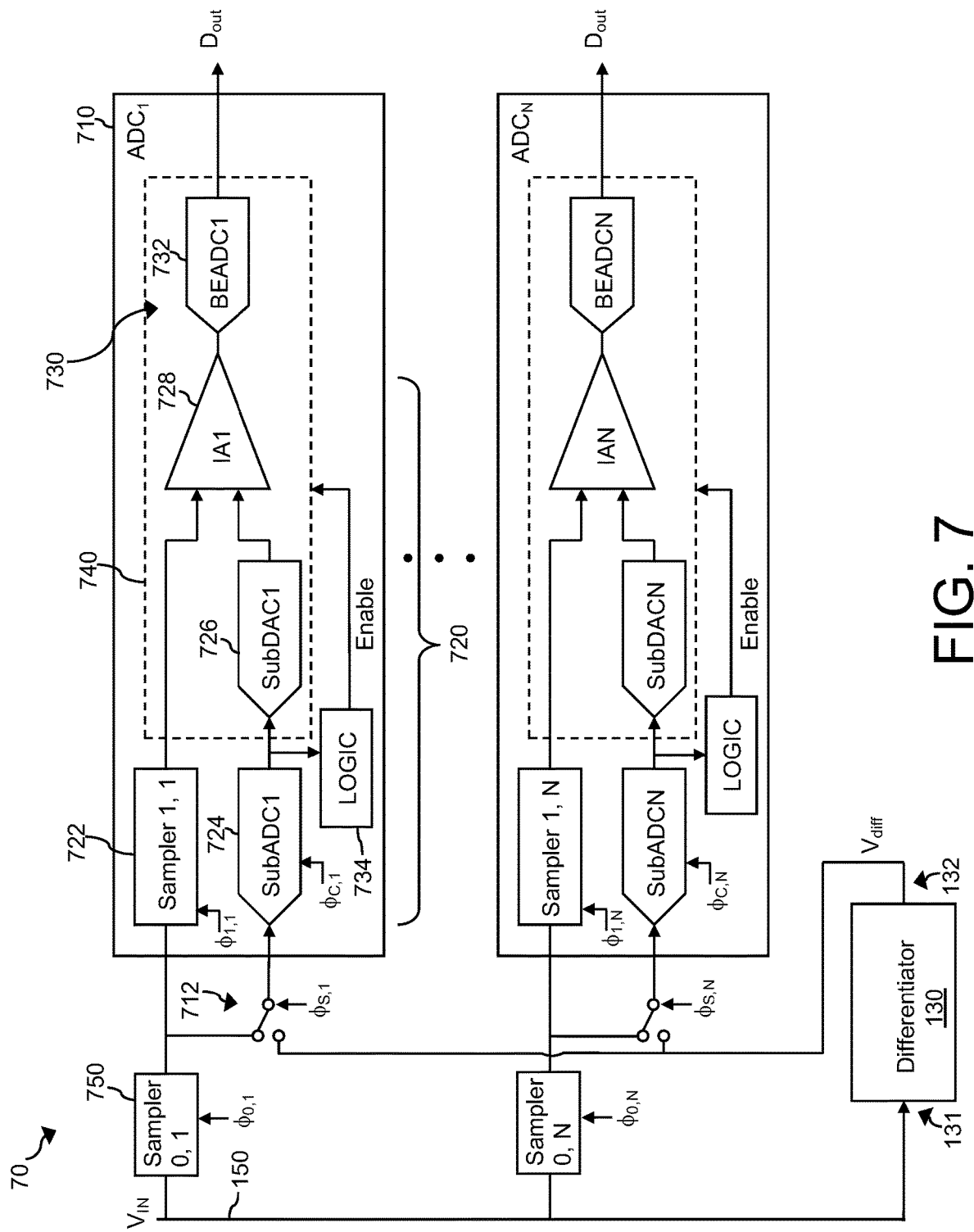
FIG. 7 is a diagram of a time-interleaved circuit according to another embodiment.

FIG. 7 is a circuit diagram of a time-interleaved circuit 70 according to another embodiment. The circuit includes a plurality of pipeline ADCs 710, a plurality of first sample circuits 750 (e.g., Sampler 0, 1), a plurality of switches 712, and a differentiator 130. The plurality of pipeline ADCs 710, the plurality of first sample circuits 750, and the plurality of switches 712 can include N pipeline ADCs 710, first sample circuits 750, and N switches 712, respectively. N is a positive integer greater than 1. In some embodiments, N can be greater than equal to 1 and less than or equal to 256, including any value or range therebetween. In other embodiments, N can be greater than 256, such as 257 to 512 or another value.

Each pipeline ADC 710 includes a first stage 720 and a backend stage 730. Each first stage 720 includes a respective second sampler circuit 722 (e.g., Sampler 1, 1), a respective sub ADC 724 (e.g., SubADC1), a respective sub DAC 726 (e.g., Sub DAC1), a respective interstage amplifier 728 (e.g., IA1). Each second sample circuit 722 has a respective input that is electrically connected to the respective output of the first sample circuit 750. The first sampler circuits 750 are configured to sample the input voltage $V_{IN}$ in a time-interleaved fashion.

Each sub ADC 724 has an input that is electrically connected to a respective switch 712. Each switch 712 has a first state in which the switch 712 is electrically connected to the output of a respective first sampler circuit 750 and a second state in which the switch 712 is electrically connected to the output of the differentiator 130.

The first sampler circuits 750 are controlled by respective first sampler circuit clock signals $\phi_{0,N}$. The second sampler circuits 722 are controlled by respective second sampler circuit clock signals $\phi_{1,N}$. The switches 712 are controlled by respective switch clock signals $\phi_{S,N}$. The sub ADCs 724 are controlled by respective sub-ADC clock signals $\phi_{C,N}$.

An output of each sub ADC 724 is electrically connected to an input of a respective sub DAC 726. An output of the sub DAC 726 is electrically connected to a first input of the interstage amplifier 728. A second input of the interstage amplifier 728 is electrically connected to an output of the second sampling circuit 722. An output of the interstage amplifier 728 is electrically connected to an input of a backend ADC 732.

Figure 8:
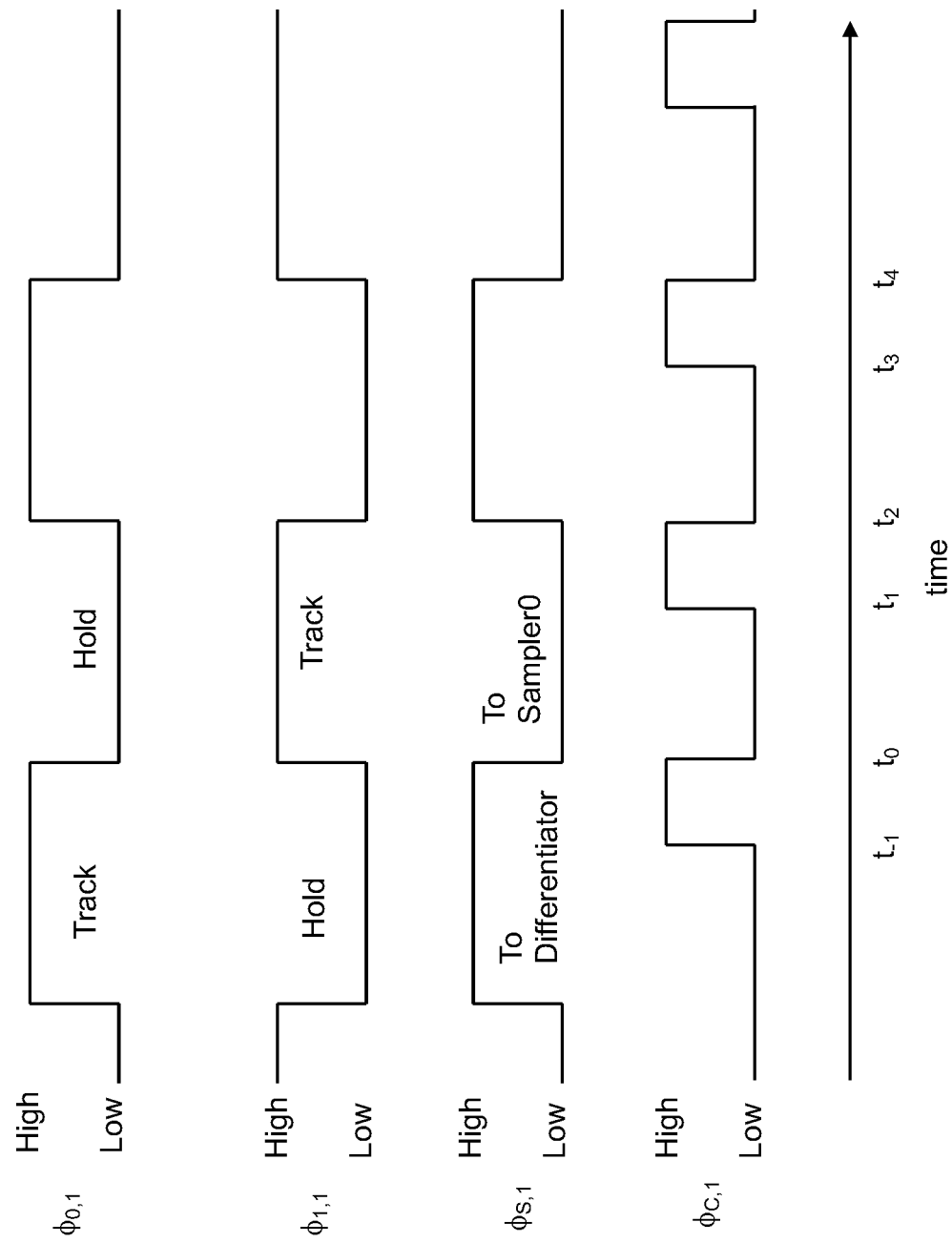
FIG. 8 is a timing diagram of clock signals for the time-interleaved circuit illustrated in FIG. 7.

FIG. 8 is a timing diagram of the clock signals for the first pipeline ADC 710 (N=1). $\phi_{0,1}$ is the clock signal for the first sampler circuit (Sampler 0, 1) 750. $\phi_{1,1}$ is the clock signal for the second sampler circuit (Sampler 1, 1) 722. $\phi_{S,1}$ is the clock signal for the first switch (Switch 1) 712. $\phi_{C,1}$ is the clock signal for the first sub-ADC (SubADC1) 724. The timing diagram of the clock signals for the other pipeline ADCs are identical to those illustrated in FIG. 8 but are time-shifted with respect to each other so that the first sampler circuits 750 sample the input voltage $V_{IN}$ in a time-interleaved manner.

When the first clock signal $\phi_{0,1}$ is high, the first sampler circuit (Sampler 0, 1) 750 tracks the input voltage $V_{IN}$. When the first clock signal $\phi_{0,1}$ transitions to low, the first sampler circuit (Sampler 0, 1) 750 samples and holds the input voltage $V_{IN}$. When the second clock signal $\phi_{1,1}$ is high, the second sampler circuit (Sampler 1, 1) 722 tracks the sampled input voltage $V_{IN}$ held by the first sampler circuit (Sampler 0, 1) 750. When the second clock signal $\phi_{1,1}$ transitions to low, the second sampler circuit (Sampler 1, 1) 722 samples and holds the sampled input voltage $V_{IN}$ held by the first sampler circuit (Sampler 0, 1) 750. The first and second clock signals $\phi_{0,1}$, $\phi_{1,1}$ have the same frequency and are out of phase with each other.

When the switch clock signal $\phi_{S,1}$ is high, the first switch (Switch 1) 712 is in a first state in which the input of the first sub-ADC (SubADC1) 724 is electrically connected to the output of the differentiator 130. When the switch clock signal $\phi_{S,1}$ is low, the first switch (Switch 1) 712 is in a second state in which the input of the first sub-ADC (SubADC1) 724 is electrically connected to the output of the first sampler circuit (Sampler 0, 1) 750. The switch clock signal $\phi_{S,1}$ has the same frequency as and is in phase with the first clock signal $\phi_{0,1}$. The switch clock signal $\phi_{S,1}$ has the same frequency as and is out of phase with the second clock signal $\phi_{1,1}$.

When the sub-ADC clock signal $\phi_{C,1}$ is high, the first sub-ADC (SubADC1) 724 tracks the signal corresponding to the state of the first switch (Switch 1) 712. When the sub-ADC clock signal $\phi_{C,1}$ transitions to low, at the falling edge of the clock, the first sub-ADC (SubADC1) 724 samples and converts the signal. The sub-ADC clock signal $\phi_{C,1}$ has twice the frequency of the switch clock signal $\phi_{S,1}$. Every other (every second) cycle of the sub-ADC clock signal $\phi_{C,1}$ is in phase with the switch clock signal $\phi_{S,1}$.

At $t_0$, the first sampler circuit (Sampler 0, 1) 750 samples and holds the input voltage $V_{IN}$, the second sampler circuit (Sampler 1, 1) 722 tracks the output of the first sampler circuit (Sampler 0, 1) 750, the switch (Switch 1) 712 transitions from the first state to the second state in which the input of the first sub-ADC (SubADC1) 724 is electrically connected to the output of the first sampler circuit (Sampler 0, 1) 750, and the first sub-ADC (SubADC1) 724 samples and converts the differentiator output voltage $V_{diff}$ of the differentiator 130, so as to provide a digital differentiator sample, which the first sub-ADC (SubADC1) 724 began tracking at $t_{-1}$. At $t_1$, the first sub-ADC (SubADC1) 724 tracks the output of the first sampler circuit (Sampler 0, 1) 750. At $t_2$, the first sampler circuit (Sampler 0, 1) 750 tracks the input voltage $V_{IN}$, the second sampler circuit (Sampler 1, 1) 722 holds the output of the first sampler circuit (Sampler 0, 1) 750 (the input voltage $V_{IN}$ previously held by the first sampler circuit (Sampler 0, 1) 750 between $t_0$ and $t_2$), the switch (Switch 1) 712 transitions from the second state to the first state in which the input of the first sub-ADC (Sub-ADC1) 724 is electrically connected to the output 132 of the differentiator circuit 130, and the first sub-ADC (SubADC1) 724 samples and converts the output of the first sampler circuit (Sampler 0, 1) 750 (the input voltage $V_{IN}$ previously held by the first sampler circuit (Sampler 0, 1) 750 between to and $t_2$).

Since the first sampler circuit (Sampler 0, 1) 750 is still holding the input voltage $V_{IN}$ that was sampled at the same time that the first sub-ADC (SubADC1) 724 sampled the output of the differentiator 130, a logic circuit 734 can use the digital differentiator output to determine whether the first pipeline ADC 710 keeps (e.g., converts) or discards the sampled input voltage $V_{IN}$. The logic circuit 734 is configured to compare the digital differentiator sample with a predetermined threshold. When the magnitude of the digital differentiator sample is below a predetermined threshold, the logic circuit 734 produces an enable signal that enables the rest of the circuits 740 (the sub DAC 726, the interstage amplifier 728, and the backend stage 730) for the corresponding ADC channel and the corresponding sampled input voltage $V_{IN}$, sampled in the next cycle of the sub-ADC clock signal $\phi_{C,1}$, is digitized (e.g., processed) as in conventional pipeline ADCs. When the magnitude of the digital differentiator sample is greater than or equal to the predetermined threshold, the logic circuit 734 produces a disable signal that disables the rest of the circuits 740 and the corresponding sampled input voltage $V_{IN}$ sampled in the next cycle of the sub-ADC clock signal $\phi_{C,1}$, is not digitized. In this way, only the samples for which the time-derivative of the input voltage $V_{IN}$, as represented by the differentiator output voltage $V_{diff}$, has a magnitude below a predetermined threshold are digitized by the ADC channels. The disabled ADC channels can be powered down or kept in a standby condition to eliminate power consumption penalty incurred by idling ADC channels.

The backend stage 730 includes the backend ADC 732 (e.g., BEADC1) that processes the residue which is the output of the interstage amplifier 728.

Figure 9:
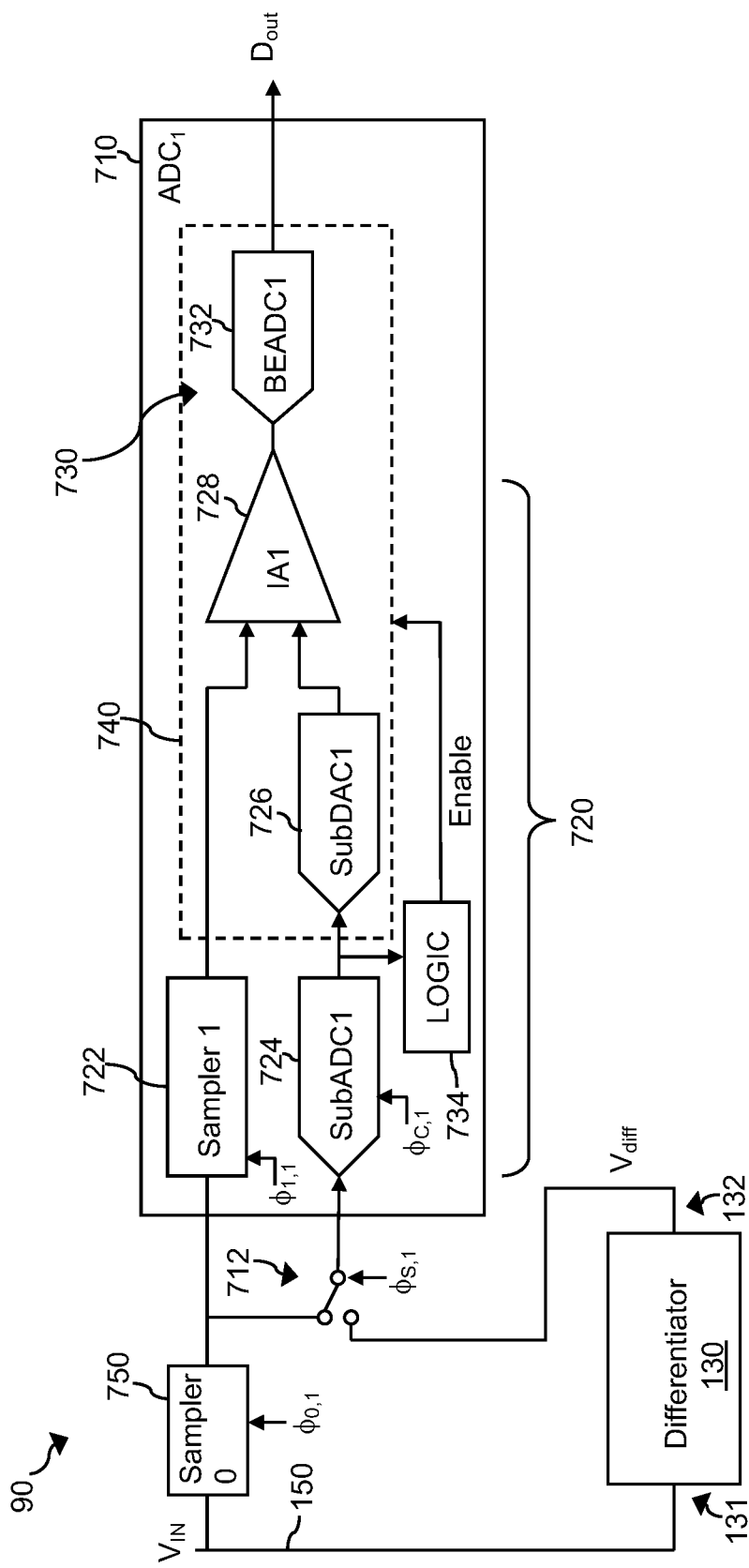
FIG. 9 is a diagram of a circuit according to another embodiment.

FIG. 9 is a circuit diagram of a circuit 90 according to another embodiment. The circuit 90 is the same as the time-interleaved circuit 70 illustrated in FIG. 7 except that circuit 90 only includes one pipeline ADC 710, one first sample circuits 750, and one switch 712.

Figure 10:
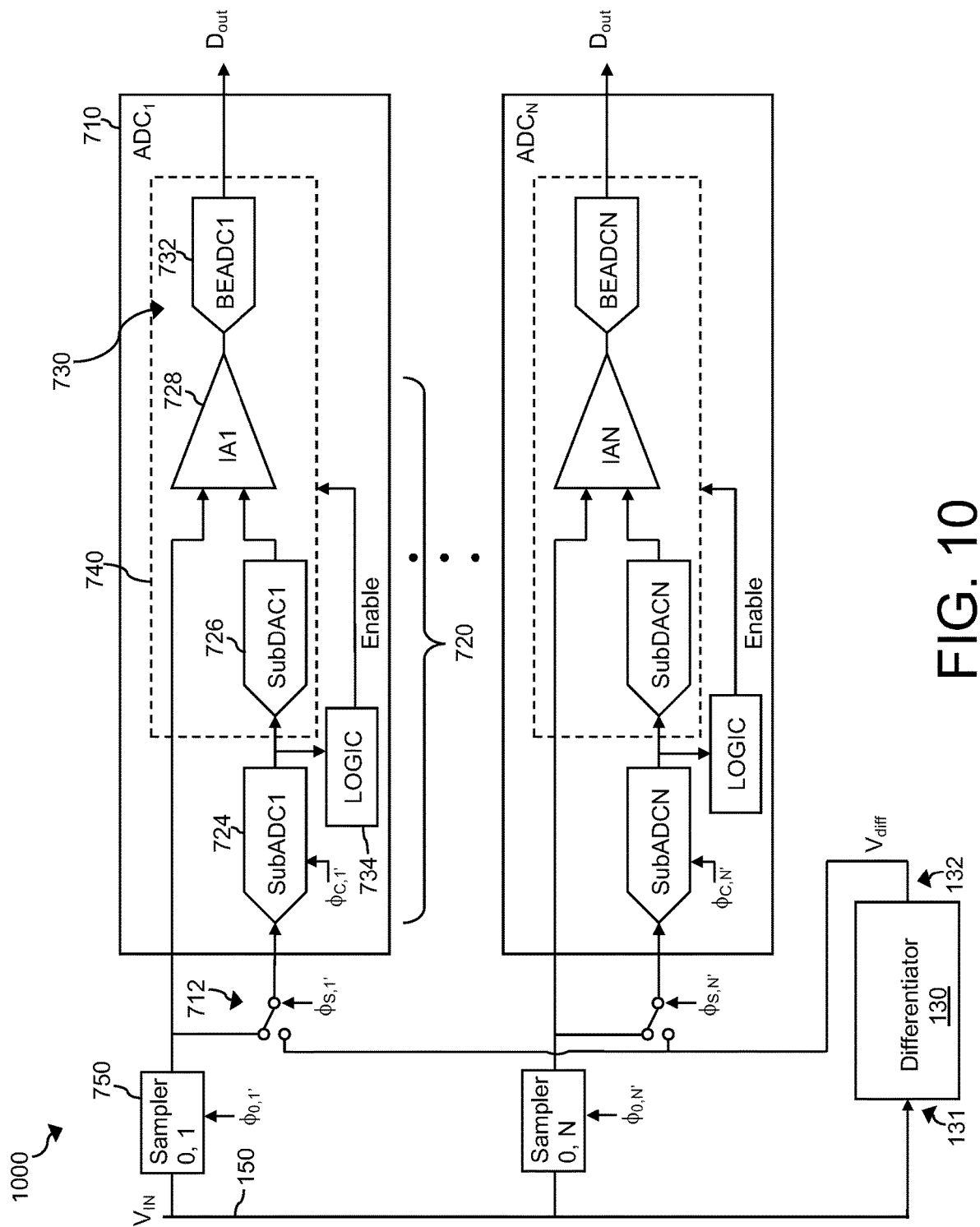
FIG. 10 is a diagram of a time-interleaved circuit according to another embodiment.

FIG. 10 is a circuit diagram of a time-interleaved circuit 1000 according to another embodiment. The time-interleaved circuit 1000 is the same as the time-interleaved circuit 90 except that the time-interleaved circuit 1000 does not include the second sampler circuits 722. In the time-interleaved circuit 1000, the output of each first sampler circuit 750 is electrically connected to a second input of the interstage amplifier 728. Thus in the time-interleaved circuit 1000 each interstage amplifier 728 has a first input electrically connected to the output of a respective sub DAC 726 and a second input electrically connected to the output of a respective first sampler circuit 750.

The first sampler circuits 750 are controlled by respective first sampler circuit clock signals $\phi_{0,N'}$. The switches 712 are controlled by respective switch clock signals $\phi_{S,N'}$. The sub ADCs 724 are controlled by respective sub-ADC clock signals $\phi_{C,N'}$.

Figure 11:
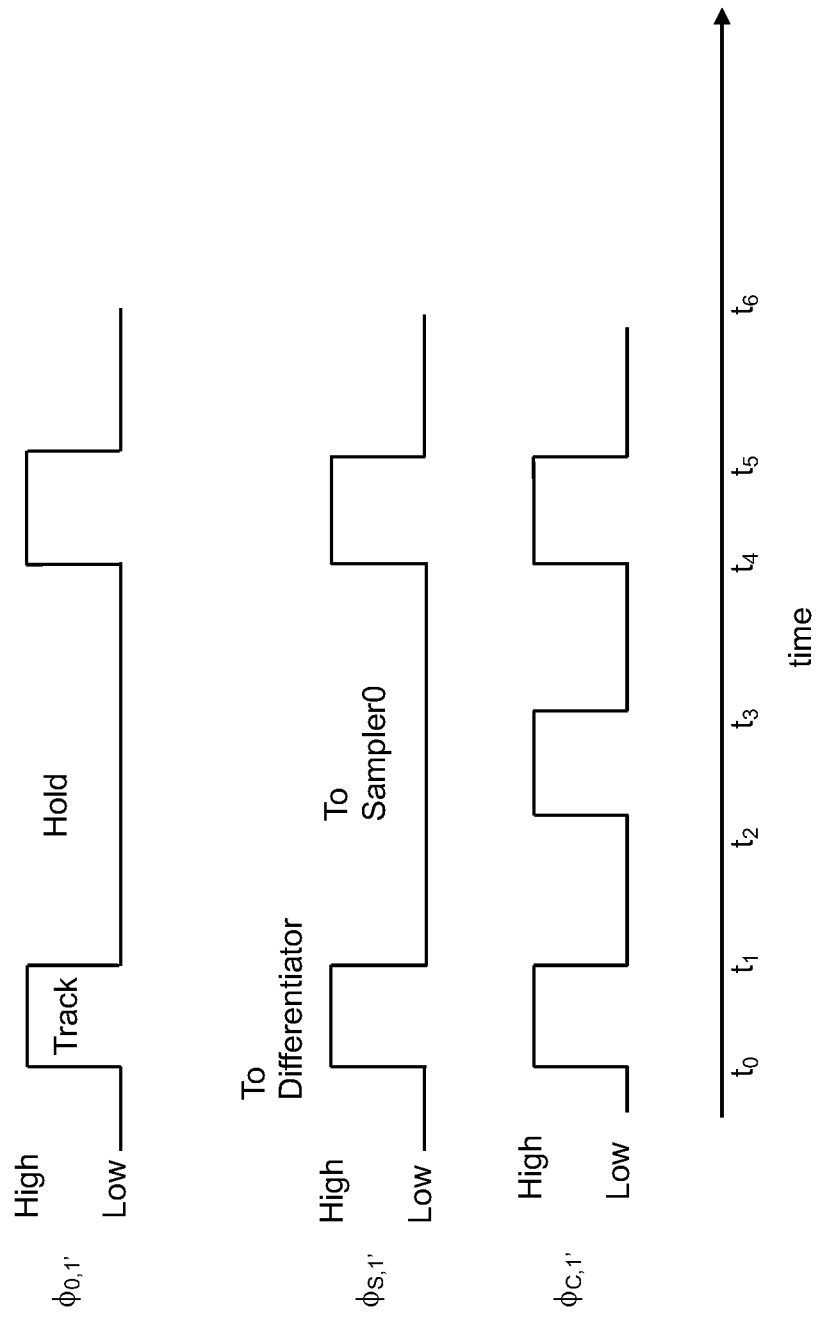
FIG. 11 is a timing diagram of clock signals for the time-interleaved circuit illustrated in FIG. 10.

FIG. 11 is a timing diagram of the clock signals for the first pipeline ADC 710 (N=1). $\phi_{0,1'}$ is the clock signal for the first sampler circuit (Sampler 0, 1) 750. $\phi_{S,1'}$ is the clock signal for the first switch (Switch 1) 712. $\phi_{C,1'}$ is the clock signal for the first sub-ADC (SubADC1) 724. The timing diagram of the clock signals for the other pipeline ADCs are identical to those illustrated in FIG. 11 but are time-shifted with respect to each other so that the first sampler circuits 750 sample the input voltage $V_{IN}$ in a time-interleaved manner.

When the first clock signal $\phi_{0,1'}$ is high, the first sampler circuit (Sampler 0, 1) 750 tracks the input voltage $V_{IN}$. When the first clock signal $\phi_{0,1'}$ transitions to low, the first sampler circuit (Sampler 0, 1) 750 samples and holds the input voltage $V_{IN}$.

When the switch clock signal $\phi_{S,1'}$ is high, the first switch (Switch 1) 712 is in a first state in which the input of the first sub-ADC (SubADC1) 724 is electrically connected to the output of the differentiator 130. When the switch clock signal $\phi_{S,1'}$ is low, the first switch (Switch 1) 712 is in a second state in which the input of the first sub-ADC (SubADC1) 724 is electrically connected to the output of the first sampler circuit (Sampler 0, 1) 750. The switch clock signal $\phi_{S,1}$ has the same frequency as and is in phase with the first clock signal $\phi_{0,1}$. In some embodiments, the switch clock signal $\phi_{S,1}$ and the first clock signal $\phi_{0,1}$ can be the same clock signal. The sub-ADC clock signal $\phi_{C,1}$ can have twice the frequency of the switch clock signal $\phi_{S,1}$. Every fourth cycle of the sub-ADC clock signal $\phi_{C,1}$ is in phase with the switch clock signal $\phi_{S,1}$.

When the sub-ADC clock signal $\phi_{C,1'}$ is high, the first sub-ADC (SubADC1) 724 tracks the signal corresponding to the state of the first switch (Switch 1) 712. When the sub-ADC clock signal $\phi_{C,1'}$ transitions to low, at the falling edge of the clock, the first sub-ADC (SubADC1) 724 samples and converts the signal.

At to, the first sampler circuit (Sampler 0, 1) 750 tracks the input voltage $V_{IN}$, the switch (Switch 1) 712 transitions from the second state to the first state in which the input of the first sub-ADC (SubADC1) 724 is electrically connected to the output 132 of the differentiator circuit 130, and the first sub-ADC (SubADC1) 724 tracks the differentiator output voltage $V_{diff}$.

At $t_0$, the first sampler circuit (Sampler 0, 1) 750 samples and holds the input voltage $V_{IN}$, the switch (Switch 1) 712 transitions to the second state in which the input of the first sub-ADC (SubADC1) 724 is electrically connected to the output of the first sampler circuit (Sampler 0, 1) 750, and the first sub-ADC (SubADC1) 724 holds and converts the differentiator output voltage $V_{diff}$. Between $t_1$ to $t_4$, the first sampler circuit (Sampler 0, 1) holds the input voltage $V_{IN}$ and the switch (Switch 1) 712 remains in the second state. At $t_2$, the first sub-ADC (SubADC1) 724 tracks the output of the first sampler circuit (Sampler 0, 1) 750. At $t_3$, the first sub-ADC (SubADC1) 724 holds and converts the output of the first sampler circuit (Sampler 0, 1) 750, which is the input voltage $V_{IN}$ sampled and held at $t_1$.

Since the first sampler circuit (Sampler 0, 1) 750 holds the input voltage $V_{IN}$ that was sampled at the same time ($t_1$) that the first sub-ADC (SubADC1) 724 sampled the differentiator output voltage $V_{diff}$, a logic circuit 734 can use the digital differentiator output to determine whether the first pipeline ADC 710 keeps (e.g., converts) or discards the converted input voltage $V_{IN}$ at $t_3$.

An advantage of the time-interleaved circuit 1000 compared to the time-interleaved circuit 70 is that in the time-interleaved circuit 1000 only one sampler circuit 750 is used for each pipeline ADC 710, thus reducing complexity and cost. This can be implemented by having enough time for the residue generation and amplification time, and improves the signal-to-noise ratio (SNR) of the signal chain.

Figure 12:
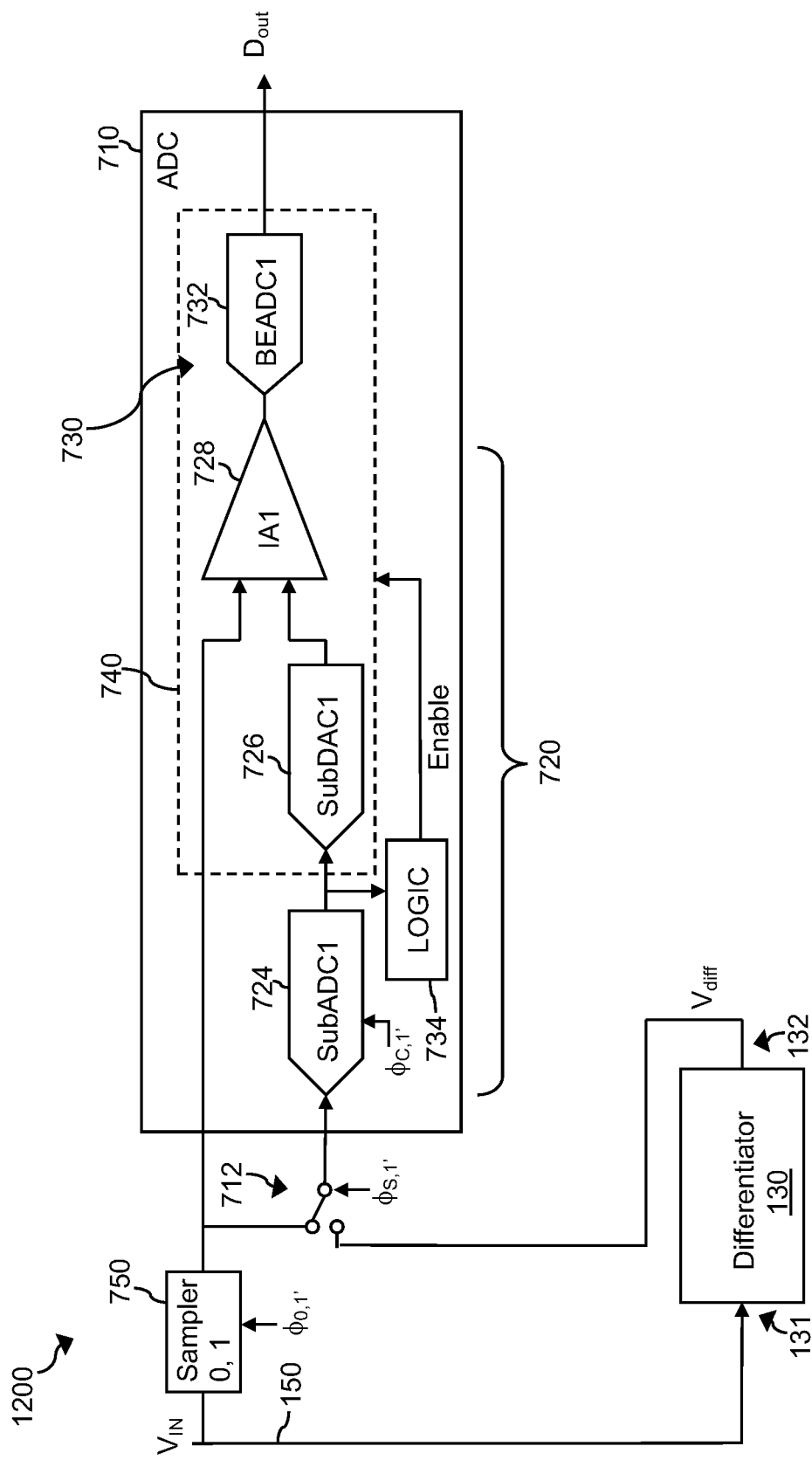
FIG. 12 is a diagram of a circuit according to another embodiment.

FIG. 12 is a circuit diagram of a circuit 1200 according to another embodiment. The circuit 1200 is the same as the time-interleaved circuit 1000 illustrated in FIG. 10 except that circuit 1200 only includes one pipeline ADC 710, one first sample circuit, 750, and one switch 712.

The invention should not be considered limited to the particular embodiments described above. Various modifications, equivalent processes, as well as numerous structures to which the invention may be applicable, will be readily apparent to those skilled in the art to which the invention is directed upon review of this disclosure. The above-described embodiments may be implemented in numerous ways. One or more aspects and embodiments involving the performance of processes or methods may utilize program instructions executable by a device (e.g., a computer, a processor, or other device) to perform, or control performance of, the processes or methods.

In this respect, various inventive concepts may be embodied as a non-transitory computer readable storage medium (or multiple non-transitory computer readable storage media) (e.g., a computer memory of any suitable type including transitory or non-transitory digital storage units, circuit configurations in Field Programmable Gate Arrays or other semiconductor devices, or other tangible computer storage medium) encoded with one or more programs that, when executed on one or more computers or other processors, perform methods that implement one or more of the various embodiments described above. When implemented in software (e.g., as an app), the software code may be executed on any suitable processor or collection of processors, whether provided in a single computer or distributed among multiple computers.

Further, it should be appreciated that a computer may be embodied in any of a number of forms, such as a rack-mounted computer, a desktop computer, a laptop computer, or a tablet computer, as non-limiting examples. Additionally, a computer may be embedded in a device not generally regarded as a computer but with suitable processing capabilities, including a Personal Digital Assistant (PDA), a smartphone or any other suitable portable or fixed electronic device.

Also, a computer may have one or more communication devices, which may be used to interconnect the computer to one or more other devices and/or systems, such as, for example, one or more networks in any suitable form, including a local area network or a wide area network, such as an enterprise network, and intelligent network (IN) or the Internet. Such networks may be based on any suitable technology and may operate according to any suitable protocol and may include wireless networks or wired networks.

Also, a computer may have one or more input devices and/or one or more output devices. These devices can be used, among other things, to present a user interface. Examples of output devices that may be used to provide a user interface include printers or display screens for visual presentation of output and speakers or other sound generating devices for audible presentation of output. Examples of input devices that may be used for a user interface include keyboards, and pointing devices, such as mice, touch pads, and digitizing tablets. As another example, a computer may receive input information through speech recognition or in other audible formats.

The non-transitory computer readable medium or media may be transportable, such that the program or programs stored thereon may be loaded onto one or more different computers or other processors to implement various one or more of the aspects described above. In some embodiments, computer readable media may be non-transitory media.

The terms "program," "app," and "software" are used herein in a generic sense to refer to any type of computer code or set of computer-executable instructions that may be employed to program a computer or other processor to implement various aspects as described above. Additionally, it should be appreciated that, according to one aspect, one or more computer programs that when executed perform methods of this application need not reside on a single computer or processor but may be distributed in a modular fashion among a number of different computers or processors to implement various aspects of this application.

Computer-executable instructions may be in many forms, such as program modules, executed by one or more computers or other devices. Generally, program modules include routines, programs, objects, components, data structures, etc. that performs particular tasks or implement particular abstract data types. The functionality of the program modules may be combined or distributed as desired in various embodiments.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that convey relationship between the fields. However, any suitable mechanism may be used to establish a relationship between information in fields of a data structure, including through the use of pointers, tags or other mechanisms that establish relationship between data elements.

Thus, the disclosure and claims include new and novel improvements to existing methods and technologies, which were not previously known nor implemented to achieve the useful results described above. Users of the method and system will reap tangible benefits from the functions now made possible on account of the specific modifications described herein causing the effects in the system and its outputs to its users. It is expected that significantly improved operations can be achieved upon implementation of the claimed invention, using the technical components recited herein.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

What is claimed is:

1. A time-interleaved circuit comprising:
   a plurality of time-interleaved analog-to-digital converters (ADCs);
   a plurality of time-interleaved sampling circuits, each sampling circuit having an input electrically coupled to an input line having an input voltage, each sampling circuit associated with a respective time-interleaved ADC, the sampling circuits configured to sample the input voltage at respective sampling times and at a sampling frequency in a time-interleaved manner;
   a differentiator having an input electrically connected to the input line and producing, at an output of the differentiator, a differentiator output voltage that represents a derivative of the input voltage with respect to time; and
   a sample-selection circuit having a first input electrically coupled to the output of the differentiator, a respective second input electrically connected to a respective output of a respective sampling circuit, and a respective output electrically connected to a respective ADC, the sample-selection circuit configured to:

electrically couple the respective sampling circuit to the respective ADC when a magnitude of the differentiator output voltage, at the respective sampling time of the respective sampling circuit, is lower than a threshold magnitude, and electrically decouple the respective sampling circuit from the respective ADC when the magnitude of the differentiator output voltage, at the respective sampling time of the respective sampling circuit, is higher than or equal to the threshold magnitude.

2. The circuit of claim 1, wherein the respective ADC is disabled when the magnitude of the differentiator output voltage, at the respective sampling time of the respective sampling circuit, is higher than or equal to the threshold magnitude.

3. The circuit of claim 1, further comprising:
a first comparator having a first input electrically connected to the output of the differentiator and a second input electrically connected to a first threshold input line having a first threshold voltage, the first threshold voltage having the threshold magnitude and a positive polarity, the first comparator producing a first-comparator output voltage at an output that is electrically connected to a first comparator input of the sample-selection circuit; and a second comparator having a first input electrically connected to the output of the differentiator and a second input electrically connected to a second threshold input line having a second threshold voltage, the second threshold voltage having the threshold magnitude and a negative polarity, the second comparator producing a second-comparator output voltage at an output that is electrically connected to a second comparator input of the sample-selection circuit, wherein the sample-selection circuit is further configured to:
electrically couple the respective sampling circuit to the respective ADC when the differentiator output voltage is lower than the first threshold voltage and higher than the second threshold voltage, and electrically decouple the respective sampling circuit from the respective ADC when the differentiator output voltage is higher than or equal to the first threshold voltage or lower than or equal to the second threshold voltage.

4. The circuit of claim 1, further comprising a differentiator ADC having an input electrically connected to the output of the differentiator and an output electrically connected to the first input of the sample-selection circuit, the differentiator ADC configured to digitize the differentiator output voltage at the sampling frequency of the sampling circuits, wherein the sample-selection circuit is configured to:
electrically couple the respective sampling circuit to the respective ADC when a magnitude of a digital differentiator output signal is lower than a threshold digital value, and electrically decouple the respective sampling circuit from the respective ADC when the magnitude of the digital differentiator output signal is higher than or equal to the threshold digital value.

5. The circuit of claim 4, wherein a resolution of the differentiator ADC is lower than a resolution of each time-interleaved ADC.

6. A time-interleaved circuit comprising:
K time-interleaved analog-to-digital converters (ADCs);
N sampling circuits, each sampling circuit having an input electrically coupled to an input line having an input voltage, the N sampling circuits configured to sample the input voltage at respective sampling times at a sampling frequency in a time-interleaved manner;

a differentiator having an input electrically connected to the input line and producing, at an output of the differentiator, a differentiator output voltage that represents to a derivative of the input voltage with respect to time;

a differentiator ADC having an input electrically connected to the output of the differentiator, the differentiator ADC configured to convert the differentiator output voltage to a digital differentiator output signal at the sampling frequency;

a digital register coupled to an output of the differentiator ADC, the digital register configured to hold N digital differentiator output signals, the N digital differentiator output signals corresponding to the input voltage sampled by the N sampling circuits at the respective sampling times; and a sample-selection circuit operably coupled to the digital register, the sample-selection circuit including a respective input electrically connected to a respective output of each sampling circuit, and a respective output electrically connected to a respective input of each ADC, the sample-selection circuit configured to:
determine K digital differentiator output signals having a lowest magnitude of the N digital differentiator output signals, and electrically couple only K sampling circuits to the K time-interleaved ADCs, the K sampling circuits corresponding to the K digital differentiator samples, wherein:
K is less than N, and
K and N are positive integers greater than 1.

7. The circuit of claim 6, wherein the sample-selection circuit includes the digital register.

8. A time-interleaved circuit comprising:
a plurality of time-interleaved analog-to-digital converters (ADCs), each ADC having respective input sampling circuitry that is electrically coupled to an input line having an input voltage, the respective input sampling circuitry configured to sample the input voltage at respective sampling times and at a sampling frequency in a time-interleaved manner;

a sample-selection circuit having a plurality of inputs, each input electrically connected to a respective output of each ADC;

a differentiator having an input electrically connected to the input line and producing, at an output of the differentiator, a differentiator output voltage that corresponds to a derivative of the input voltage with respect to time;

a first comparator having a first input electrically connected to the output of the differentiator and a second input electrically connected to a first threshold input line having a first threshold voltage, the first threshold voltage having a threshold magnitude and a positive polarity, the first comparator producing a first-comparator output voltage at an output of the first comparator;

a second comparator having a first input electrically connected to the output of the differentiator and a second input electrically connected to a second threshold input line having a second threshold voltage, the second threshold voltage having the threshold magnitude and a negative polarity, the second comparator producing a second-comparator output voltage at an output of the second comparator; and a logic circuit having a first input electrically connected to the output of the first comparator and a second input electrically connected to the output of the second comparator, the logic circuit configured to:
  enable the respective channel for each ADC in which the differentiator output voltage at the respective sampling time for a respective ADC is between the first and second threshold voltages, and
  disable the respective channel for each ADC in which the differentiator output voltage at the respective sampling time is higher than the first threshold voltage or lower than the second threshold voltage.

9. A circuit comprising:
an analog-to-digital converter (ADC) having input sampling circuitry that is electrically coupled to an input line having an input voltage, the input sampling circuitry configured to sample the input voltage at sampling times and at a sampling frequency;
a differentiator having an input electrically connected to the input line and producing, at an output of the differentiator, a differentiator output voltage that corresponds to a derivative of the input voltage with respect to time;
a first comparator having a first input electrically connected to the output of the differentiator and a second input electrically connected to a first threshold input line having a first threshold voltage, the first threshold voltage having a threshold magnitude and a positive polarity, the first comparator producing a first-comparator output voltage at an output of the first comparator;
a second comparator having a first input electrically connected to the output of the differentiator and a second input electrically connected to a second threshold input line having a second threshold voltage, the second threshold voltage having the threshold magnitude and a negative polarity, the second comparator producing a second-comparator output voltage at an output of the second comparator; and
a logic circuit having a first input electrically connected to the output of the first comparator and a second input electrically connected to the output of the second comparator, the logic circuit configured to:
  enable the ADC when the differentiator output voltage, at a sampling time of the ADC, is between the first and second threshold voltages, and
  disable the ADC when the differentiator output voltage, at the sampling time of the ADC, is higher than the first threshold voltage or lower than the second threshold voltage.

10. A time-interleaved circuit comprising:
a plurality of time-interleaved analog-to-digital converters (ADCs), each ADC having respective input sampling circuitry that is electrically coupled to an input line having an input voltage, the respective input sampling circuitry configured to sample the input voltage at respective sampling times and at a sampling frequency in a time-interleaved manner;
a differentiator having an input electrically connected to the input line and producing, at an output of the differentiator, a differentiator output voltage that corresponds to a derivative of the input voltage with respect to time;
a differentiator ADC having an input electrically connected to the output of the differentiator, the differentiator ADC configured to convert the differentiator output voltage to a digital differentiator output signal; and
a sample-selection circuit having a first input electrically connected to an output of the differentiator ADC and a plurality of second inputs, each second input electrically connected to a respective output of each ADC, wherein the sample-selection circuit is configured to:
  enable a respective channel for each ADC in which a magnitude of the digital differentiator output signal at the respective sampling time for a respective ADC is lower than a predetermined digital threshold, and
  disable the respective channel for each ADC in which the magnitude of the digital differentiator output signal at the respective sampling time for the respective ADC is higher than or equal to the predetermined digital threshold.

11. A circuit comprising:
a primary analog-to-digital converter (ADC) having input sampling circuitry that is electrically coupled to an input line having an input voltage, the input sampling circuitry configured to sample the input voltage at a sampling frequency;
a differentiator having an input electrically connected to the input line and producing, at an output of the differentiator, a differentiator output voltage that corresponds to a derivative of the input voltage with respect to time;
a differentiator ADC having an input electrically connected to the output of the differentiator, the differentiator ADC configured to convert the differentiator output voltage to a digital differentiator output signal; and
a sample-selection circuit having a first input electrically connected to an output of the differentiator ADC and a second input electrically connected to an output of the primary ADC, wherein the sample-selection circuit is configured to:
  enable the primary ADC when the digital differentiator output signal, at a sampling time for the primary ADC, is lower than a predetermined digital threshold, and
  disable the primary ADC when the digital differentiator output signal, at the sampling time for the primary ADC, is higher than or equal to the predetermined digital threshold.

12. A time-interleaved circuit comprising:
a differentiator having an input electrically connected to an input line having an input voltage, the differentiator producing, at an output of the differentiator, a differentiator output voltage that corresponds to a derivative of the input voltage with respect to time;
a plurality of time-interleaved first sampling circuits, each first sampling circuit having an input electrically coupled to the input line, the first sampling circuits configured to sample the input voltage at respective sampling times and at a sampling frequency in a time-interleaved manner;
a plurality of switches, each switch having a respective first state in which a respective switch is electrically connected to an output of a respective first sampling circuit and a respective second state in which the respective switch is electrically connected to the output of the differentiator; and a plurality of pipeline analog-to-digital converters (ADCs), each pipeline ADC comprising:
- a respective second sampling circuit having an input electrically connected to the output of a respective first sampling circuit;
- a respective sub ADC having an input electrically connected to the respective switch;
- a respective sub digital-to-analog converter (DAC) having an input electrically connected to an output of the respective sub ADC;
- a respective interstage amplifier having a first input electrically connected to an output of the respective sub DAC and a second input electrically connected to an output of the respective second sampling circuit;
- a respective backend ADC having an input electrically connected to an output of the respective interstage amplifier; and
- a respective logic circuit having an input electrically connected to the output of the respective sub ADC and an output electrically coupled to the respective DAC, to the respective interstage amplifier, and/or to the respective backend ADC, wherein for each pipeline ADC:
- at a respective first time ($t_0$), the respective first sampling circuit samples and holds a respective sampled input voltage, the respective second sampling circuit tracks the respective sampled input voltage at the output of the respective first sampling circuit, the respective switch transitions from the respective first state to the respective second state, and the respective sub ADC holds and converts the differentiator output voltage to a respective digital differentiator output signal,
- at a respective second time ($t_1$), the respective sub ADC tracks the output of the respective first sampling circuit,
- at a respective third time ($t_2$), the respective first sampling circuit tracks the input voltage, the respective second sampling circuit holds the respective sampled input voltage at the output of the respective first sampling circuit, the respective switch transitions from the respective second state to the respective first state, and the respective sub ADC holds and converts the respective sampled input voltage at the output of the respective first sampling circuit,
- the respective logic circuit is configured to enable the respective DAC, the respective interstage amplifier, and/or the respective backend ADC to process the respective sampled input voltage when a magnitude of the respective digital differentiator output signal is below a predetermined digital threshold,
- the respective logic circuit is configured to disable the respective DAC, the respective interstage amplifier, and/or the backend ADC when the magnitude of the respective digital differentiator output signal is higher than or equal to the predetermined digital threshold, and $t_0 < t_1 < t_2$.

13. A circuit comprising:
- a differentiator having an input electrically connected to an input line having an input voltage, the differentiator producing, at an output of the differentiator, a differentiator output voltage that corresponds to a derivative of the input voltage with respect to time;
- a first sampling circuit having an input electrically coupled to the input line, the first sampling circuit configured to sample the input voltage at sampling times and at a sampling frequency;
- a switch having a first state in which the switch is electrically connected to an output of the first sampling circuit and a second state in which the switch is electrically connected to the output of the differentiator;
- a pipeline analog-to-digital converter (ADC) comprising:
  - a second sampling circuit having an input electrically connected to the output of the first sampling circuit;
  - a sub ADC having an input electrically connected to the switch;
  - a sub digital-to-analog converter (DAC) having an input electrically connected to an output of the sub ADC;
  - an interstage amplifier having a first input electrically connected to an output of the sub DAC and a second input electrically connected to an output of the second sampling circuit;
  - a backend ADC having an input electrically connected to an output of the respective interstage amplifier; and
  - a logic circuit having an input electrically connected to the output of the sub ADC and an output electrically coupled to the DAC, to the interstage amplifier, and/or to the backend ADC, wherein:
  - at a first time ($t_0$), the first sampling circuit samples and holds a sampled input voltage, the second sampling circuit tracks the sampled input voltage at the output of the first sampling circuit, the switch transitions from the first state to the second state, and the sub ADC holds and converts the differentiator output voltage to a digital differentiator output signal,
  - at a second time ($t_1$), the sub ADC tracks the output of the first sampling circuit,
  - at a third time ($t_2$), the first sampling circuit tracks the input voltage, the second sampling circuit holds the sampled input voltage at the output of the first sampling circuit, the switch transitions from the second state to the first state, and the sub ADC holds and converts the sampled input voltage at the output of the first sampling circuit,
  - the logic circuit is configured to enable the DAC, the interstage amplifier, and/or the ADC to process the sampled input voltage when a magnitude of the respective digital differentiator output signal is below a predetermined digital threshold,
  - the logic circuit is configured to disable the DAC, the interstage amplifier, and/or the backend ADC when the magnitude of the digital differentiator output signal is higher than or equal to the predetermined digital threshold, and $t_0 < t_1 < t_2$.

14. A time-interleaved circuit comprising:
a differentiator having an input electrically connected to an input line having an input voltage, the differentiator producing, at an output of the differentiator, a differentiator output voltage that corresponds to a derivative of the input voltage with respect to time;

a plurality of time-interleaved sampling circuits, each sampling circuit having an input electrically coupled to the input line, the sampling circuits configured to sample the input voltage at respective sampling times and at a sampling frequency in a time-interleaved manner;

a plurality of switches, each switch having a respective first state in which a respective switch is electrically connected to an output of a respective sampling circuit and a respective second state in which the respective switch is electrically connected to the output of the differentiator; and a plurality of pipeline analog-to-digital converters (ADCs), each pipeline ADC comprising:
  a respective sub ADC having an input electrically connected to the respective switch;
  a respective sub digital-to-analog converter (DAC) having an input electrically connected to an output of the respective sub ADC;
  a respective interstage amplifier having a first input electrically connected to an output of the respective sub DAC and a second input electrically connected to an output of the respective sampling circuit;
  a respective backend ADC having an input electrically connected to an output of the respective interstage amplifier; and
  a respective logic circuit having an input electrically connected to the output of the respective sub ADC and an output electrically coupled to the respective DAC, to the respective interstage amplifier, and/or to the respective backend ADC,
  wherein for each pipeline ADC:
    at a respective first time ($t_0$), the respective sampling circuit tracks the input voltage, the respective switch transitions from the respective first state to the respective second state, and the respective sub ADC tracks the differentiator output voltage,
    at a respective second time ($t_1$), the respective sampling circuit samples and holds a respective sampled input voltage, the respective switch transitions from the respective second state to the respective first state, and the respective sub ADC holds and converts the differentiator output voltage to a respective digital differentiator output signal,
    at a respective third time ($t_2$), the respective sampling circuit continues to hold the respective sampled input voltage, the respective switch is in the respective first state, and the respective sub ADC tracks the respective sampled input voltage at the output of the respective sampling circuit,
    at a respective fourth time ($t_3$), the respective sampling circuit continues to hold the respective sampled input voltage, the respective switch is in the respective first state, and the respective sub ADC holds and converts the respective sampled input voltage at the output of the respective sampling circuit,
    the respective logic circuit is configured to enable the respective DAC, the respective interstage amplifier, and/or the respective backend ADC to process the respective sampled input voltage when a magnitude of the respective digital differentiator output signal is below a predetermined digital threshold,
    the respective logic circuit is configured to disable the respective DAC, the respective interstage amplifier, and/or the backend ADC when the magnitude of the respective digital differentiator output signal is higher than or equal to the predetermined digital threshold, and $t_0 < t_1 < t_2 < t_3$.

15. A circuit comprising:
a differentiator having an input electrically connected to an input line having an input voltage, the differentiator producing, at an output of the differentiator, a differentiator output voltage that corresponds to a derivative of the input voltage with respect to time;
a sampling circuit having an input electrically coupled to the input line, the sampling circuit configured to sample the input voltage at sampling times and at a sampling frequency;
a switch having a first state in which the switch is electrically connected to an output of the sampling circuit and a second state in which the switch is electrically connected to the output of the differentiator; and
a pipeline analog-to-digital converter (ADC) comprising:
  a sub ADC having an input electrically connected to the switch;
  a sub digital-to-analog converter (DAC) having an input electrically connected to an output of the sub ADC;
  an interstage amplifier having a first input electrically connected to an output of the sub DAC and a second input electrically connected to an output of the sampling circuit;
  a backend ADC having an input electrically connected to an output of the interstage amplifier; and
  a logic circuit having an input electrically connected to the output of the sub ADC and an output electrically coupled to the DAC, to the interstage amplifier, and/or to the backend ADC,
  wherein:
    at a first time ($t_0$), the sampling circuit tracks the input voltage, the switch transitions from the first state to the second state, and the sub ADC tracks the differentiator output voltage,
    at a second time ($t_1$), the sampling circuit samples and holds a sampled input voltage, the switch transitions from the second state to the first state, and the sub ADC holds and converts the differentiator output voltage to a digital differentiator output signal,
    at a third time ($t_2$), the sampling circuit continues to hold the sampled input voltage, the switch is in the first state, and the sub ADC tracks the sampled input voltage at the output of the sampling circuit,
    at a fourth time ($t_3$), the sampling circuit continues to hold the sampled input voltage, the switch is in the first state, and the sub ADC holds and converts the sampled input voltage at the output of the sampling circuit,
    the logic circuit is configured to enable the DAC, the interstage amplifier, and/or the backend ADC to process the sampled input voltage when a magnitude of the digital differentiator output signal is below a predetermined digital threshold,
    the logic circuit is configured to disable the DAC, the interstage amplifier, and/or the ADC when the magnitude of the digital differentiator output signal is higher than or equal to the predetermined digital threshold, and $t_0 < t_1 < t_2 < t_3$.

* * * * *